(12) United States Patent
Shi et al.

(10) Patent No.: US 12,002,797 B2
(45) Date of Patent: Jun. 4, 2024

(54) LED DEVICE AND LIGHT EMITTING APPARATUS INCLUDING THE SAME

(71) Applicant: Quanzhou San'an Semiconductor Technology Co., Ltd., Quanzhou (CN)

(72) Inventors: Junpeng Shi, Fujian (CN); Chen-Ke Hsu, Fujian (CN); Chang-Chin Yu, Fujian (CN); Yanqiu Liao, Fujian (CN); Zhenduan Lin, Fujian (CN); Zhaowu Huang, Fujian (CN); Senpeng Huang, Fujian (CN)

(73) Assignee: QUANZHOU SAN'AN SEMICONDUCTOR TECHNOLOGY CO., LTD., Nan'an (CN)

( * ) Notice: Subject to any disclaimer, the term of this patent is extended or adjusted under 35 U.S.C. 154(b) by 0 days.

(21) Appl. No.: 17/946,767

(22) Filed: Sep. 16, 2022

(65) Prior Publication Data

US 2023/0018253 A1 Jan. 19, 2023

Related U.S. Application Data

(63) Continuation of application No. 16/742,149, filed on Jan. 14, 2020, now Pat. No. 11,450,651.

(30) Foreign Application Priority Data

Jan. 15, 2019 (WO) ................ PCT/CN2019/071771

(51) Int. Cl.
*H01L 25/16* (2023.01)
*H01L 27/15* (2006.01)
(Continued)

(52) U.S. Cl.
CPC .......... *H01L 25/167* (2013.01); *H01L 27/156* (2013.01); *H01L 33/56* (2013.01); *H01L 33/62* (2013.01)

(58) Field of Classification Search
CPC ..... H01L 25/167; H01L 27/156; H01L 33/56; H01L 33/62; H01L 2933/005; H01L 25/0753; H01L 33/36; H01L 33/52
See application file for complete search history.

(56) References Cited

U.S. PATENT DOCUMENTS 6,486,543 B1 * 11/2002 Sano ........................ H01L 24/97
438/106
10,753,551 B2 * 8/2020 Hasegawa ................. F21K 9/60
(Continued)

FOREIGN PATENT DOCUMENTS

| CN | 1956178 A | 5/2007 |
| CN | 107134469 A | 9/2017 |
| WO | WO2017150804 | 9/2017 |

OTHER PUBLICATIONS

Search report issued to PCT Application No. PCT/CN/2019/071771 by CNIPA dated Oct. 17, 2019.

*Primary Examiner* — Victor A Mandala
(74) *Attorney, Agent, or Firm* — Muncy, Geissler, Olds & Lowe, P.C.

(57) ABSTRACT

A LED device includes multiple LED chips each including opposite first and second surfaces, a side surface, and an electrode assembly disposed on the second surface and including first and second electrodes. The first surface of each of the LED chips is a light exit surface. The LED device further includes an electric circuit layer assembly disposed on the second surfaces of the LED chips and having opposite first and second surfaces and a side surface. The first surface is electrically connected to the first and second electrodes. The LED device further includes an encapsulating layer enclosing the LED chips and the electric circuit layer assembly to expose the second surface of the electric circuit layer assembly.

19 Claims, 21 Drawing Sheets

(51) Int. Cl.
*H01L 33/56* (2010.01)
*H01L 33/62* (2010.01)

(56) References Cited

U.S. PATENT DOCUMENTS

| | | | |
|---|---|---|---|
| 2011/0181182 A1* | 7/2011 | Hsieh | H01L 25/167 |
| | | | 315/32 |
| 2016/0240745 A1* | 8/2016 | Kim | H01L 33/50 |
| 2016/0293811 A1* | 10/2016 | Hussell | H01L 33/60 |
| 2018/0045383 A1* | 2/2018 | Hasegawa | H01L 25/18 |
| 2018/0226384 A1* | 8/2018 | Park | H01L 33/58 |
| 2019/0013443 A1* | 1/2019 | Nakabayashi | H01L 33/60 |
| 2019/0067255 A1* | 2/2019 | Lim | H01L 33/486 |
| 2019/0252588 A1* | 8/2019 | Maki | H01L 33/56 |
| 2020/0075564 A1* | 3/2020 | Lin | H01L 24/83 |

* cited by examiner

Providing a plurality of LED chips, and arranging the LED chips such that electrode assemblies of the LED chips are on the same side Forming a first encapsulating sub-layer to fix the LED chips, wherein the first encapsulating sub-layer covers side surfaces of the LED chips and exposes first surfaces of the LED chips Forming an electric circuit layer assembly on the first encapsulating sub-layer such that the first encapsulating sub-layer is electrically connected to the electrode assemblies of the LED chips Forming a second encapsulating sub-layer on the first encapsulating sub-layer, wherein the second encapsulating sub-layer covers a part of the electric circuit layer assembly and exposes a second surface of the electric circuit layer assembly

FIG.7

LED DEVICE AND LIGHT EMITTING APPARATUS INCLUDING THE SAME

CROSS-REFERENCE TO RELATED APPLICATION

This application is a continuation application of U.S. patent application Ser. No. 16/742,149, which claims priority of International Application No. PCT/CN2019/071771 filed on Jan. 15, 2019. The entire content of each of the U.S. and international patent application is incorporated herein by reference.

FIELD

The disclosure relates to a semiconductor device, and more particularly to a LED device and a light emitting apparatus including the same.

BACKGROUND

Light-emitting diode (LED) is a light source used in various lighting and electronic devices, such as display devices of televisions, mobile phones, notebook computers, personal digital assistants, etc. The resolution of the display devices can be increased by miniaturizing the LED devices, resulting in wider application of the display devices.

WO 2017/150804 A1 discloses a LED display device that includes a plurality of LED chips that are fixed to a package substrate and are connected to multiple electrodes through wire bonding. The wire-bonding structure occupies a certain space around each LED chip, leading to a large size of the LED display device.

CN 107134469 A discloses a light-emitting device that utilizes flip-chip technique to bond multiple LED chips to conductive traces on a circuit board. Such light-emitting device might have a smaller dimension as compared to the light-emitting device with the wire-bonding structure. However, the flip-chip technique requires the conductive traces to have an accurate dimension and position on the circuit board, as well as a highly precise alignment between the LED chips and the conductive traces, which incur a high manufacturing cost.

SUMMARY

Therefore, an aspect of the disclosure is to provide a LED device and a light emitting apparatus including the same that can alleviate the drawback of the prior art.

A first aspect of this disclosure is to provide a LED device which includes a plurality of LED chips, an electric circuit layer assembly, and an encapsulating layer.

Each of the LED chips includes opposite first and second surfaces, a side surface that is connected between the first and second surfaces, and an electrode assembly that is disposed on the second surface of the LED chip and that includes a first electrode and a second electrode. The first surface of each of the LED chips is a light exit surface. The electric circuit layer assembly is disposed on the second surfaces of the LED chips, and has opposite first and second surfaces and a side surface that is connected between the first and second surfaces of the electric circuit layer assembly. The first surface of the electric circuit layer assembly is electrically connected to the first and second electrodes of the electrode assembly. The encapsulating layer encloses the LED chips and the electric circuit layer assembly in such a manner that the second surface of the electric circuit layer assembly is exposed from the encapsulating layer.

A second aspect of this disclosure is to provide a light-emitting apparatus that includes the abovementioned LED device.

A third aspect of this disclosure is to provide another light-emitting apparatus that includes a circuit board and a plurality of the abovementioned LED devices which are arranged on the circuit board. The LED chips of each of the LED devices are defined into at least one pixel.

BRIEF DESCRIPTION OF THE DRAWINGS

Other features and advantages of the disclosure will become apparent in the following detailed description of the embodiments with reference to the accompanying drawings, of which:

FIG. 7 is a flow chart illustrating a method for manufacturing the embodiment of the LED device according to the present disclosure;

DETAILED DESCRIPTION

Figure 1:
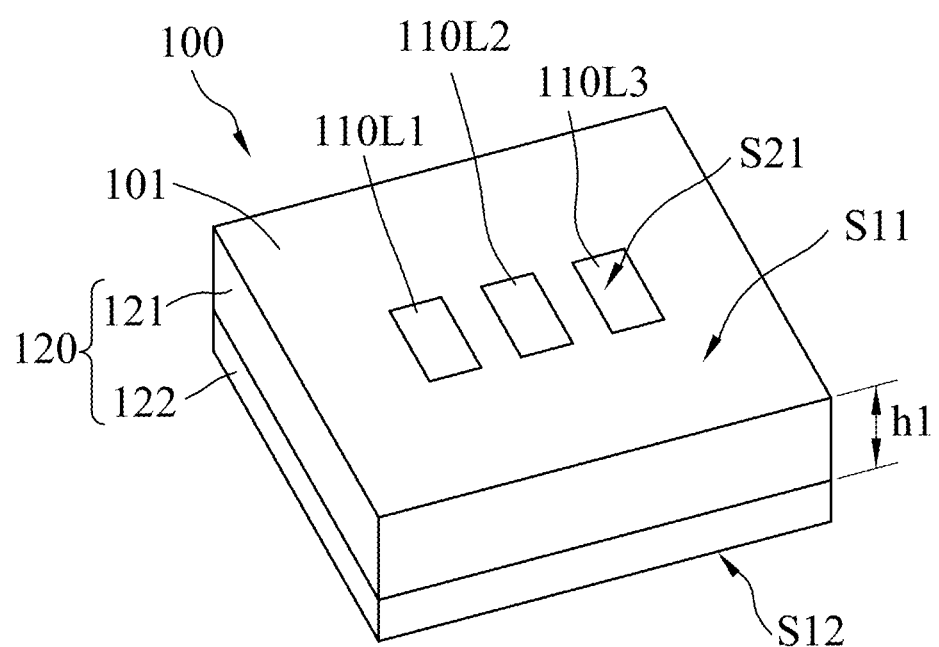
FIG. 1 is a perspective view of an embodiment of a LED device according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
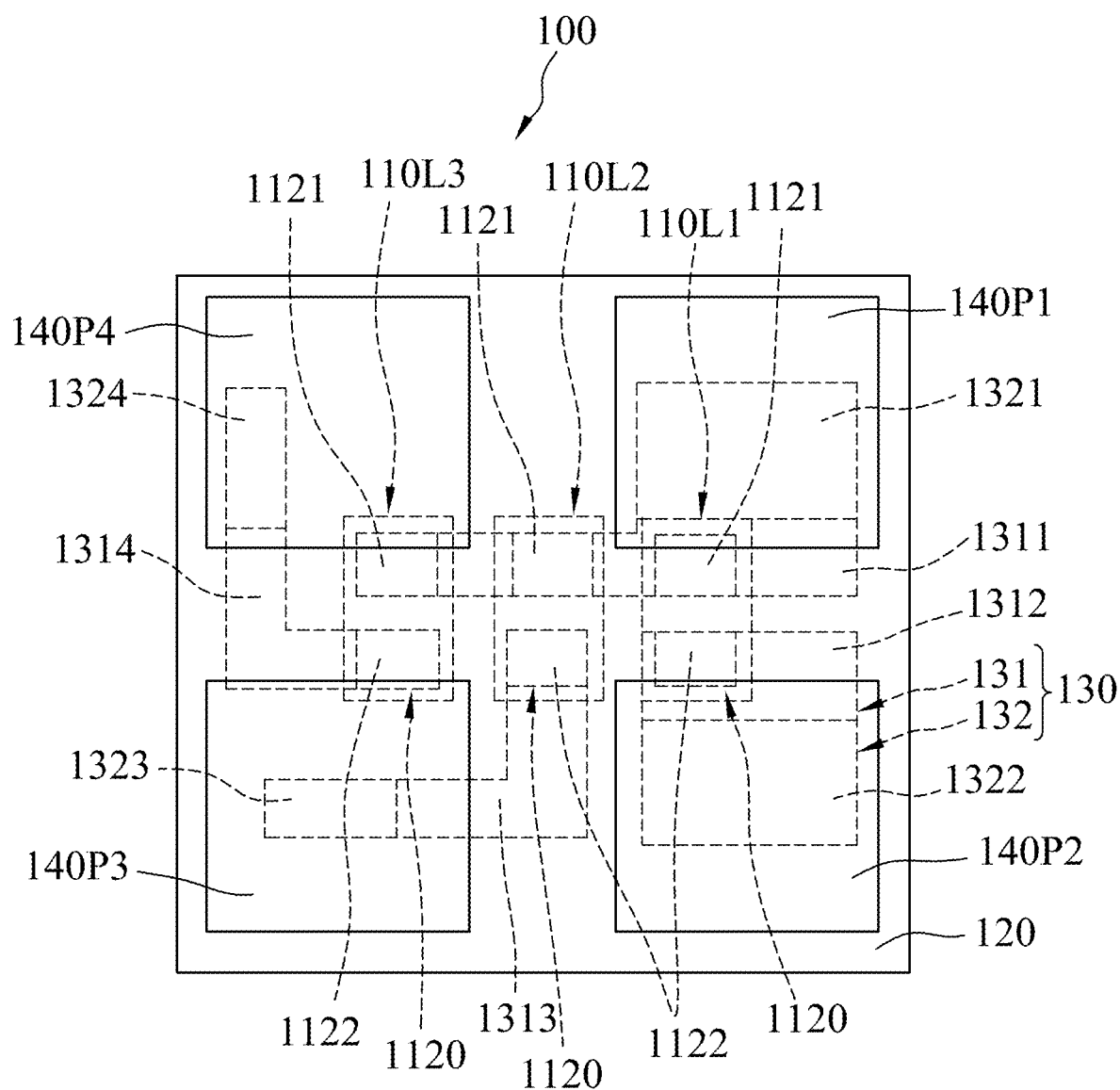
FIG. 2 is a schematic top view of the embodiment.
Figure 3A:
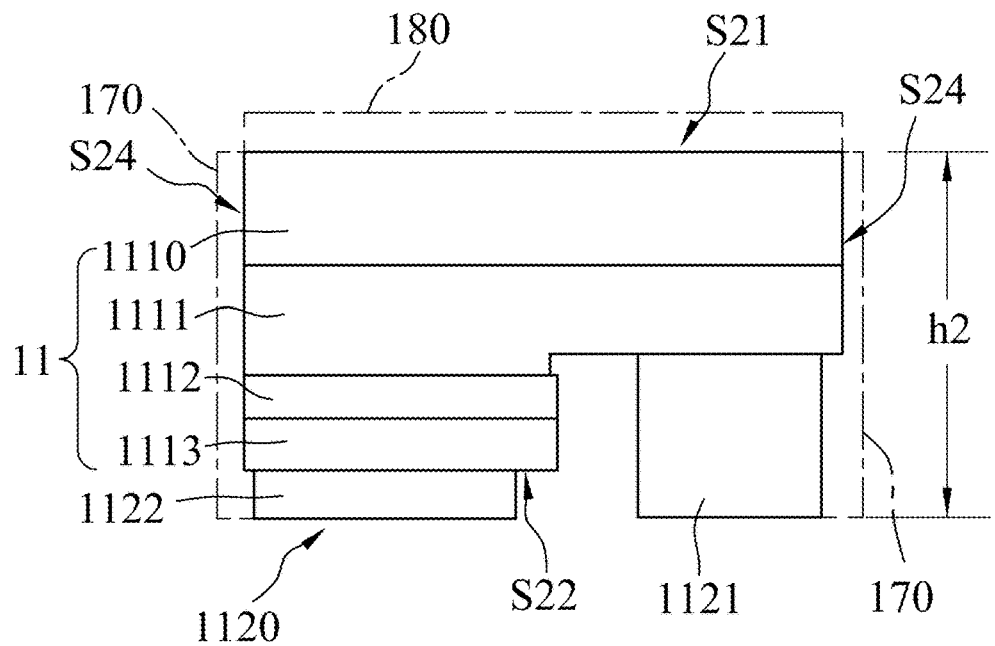
FIG. 3(A) is a schematic side view of a LED chip of the embodiment.

FIGS. 1 and 2 illustrate an embodiment of a LED device 100 according to the present disclosure. Referring further to FIG. 3(A), in this embodiment, the LED device 100 is substrate-free, and includes a plurality of LED chips (110L1, 110L2, 110L3), each of which includes opposite first and second surfaces (S21, S22), and a side surface (S24) that is connected between the first and second surfaces (S21, S22). The first surface (S21) of each of the LED chips (110L1-110L3) is a light exit surface. As shown in FIGS. 1 and 2, the LED device 100 further includes a first surface 101 that contains the first surface (S21) of each of the LED chips (110L1-110L3), an electric circuit layer assembly 130 that is disposed on the second surfaces (S22) of the LED chips (110L1-110L3), an encapsulating layer 120 that encloses the LED chips (110L1-110L3) and the electric circuit layer assembly 130, and a plurality of bond pads (140P1, 140P2, 140P3, 140P4) that are disposed on the encapsulating layer 120 and that are electrically connected to the electric circuit layer assembly 130.

Figure 18:
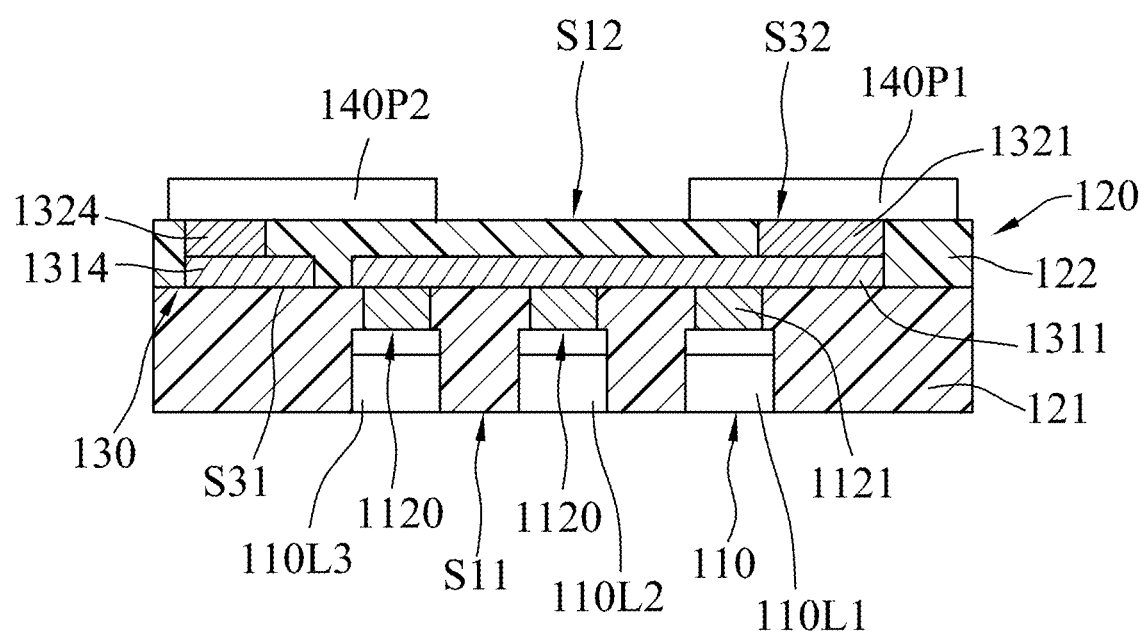
FIG. 18 is sectional view taken along line II-II of FIG. 17.

Referring further to FIG. 18, each of the LED chips (110L1-110L3) further includes an electrode assembly 1120 that is disposed on the second surface (S22) of the LED chip, and that includes a first electrode 1121 and a second electrode 1122. The electric circuit layer assembly 130 has opposite first and second surfaces (S31, S32) and a side surface (S33) that is connected between the first and second surfaces (S31, S32) of the electric circuit layer assembly 130. The first surface (S31) of the electric circuit layer assembly 130 is electrically connected to the first and second electrodes 1121, 1122 of the electrode assembly 1120.

It should be noted that the embodiment of the LED device 100 is exemplified to include three LED chips (110L1-110L3), but the number of the LED chips (110L1-110L3) may be changed according to practical requirements. The LED chips (110L1-110L3) may emit lights with the same or different wavelength(s). In an example, the LED chips (110L1-110L3) may emit blue light or ultraviolet light. In other examples, at least one of the LED chips (110L1-110L3) is capable of emitting a light with a first wavelength, and the remainder of the LED chips (110L1-110L3) is capable of emitting a light with a second wavelength that is different from the first wavelength. In other examples, the LED chips (110L1-110L3) may respectively emit red light, green light and blue light. A distance between adjacent two of the LED chips (110L1-110L3) may be less than 100 μm, such as ranging from 50 to 100 μm, or even less than 50 μm, for reducing the overall size of the LED device 100. In certain applications, such as those in display panels, the distance between adjacent two of the LED chips (110L1-110L3) is less than 50 μm, such as ranging from 40 to 50 μm, 30 to 40 μm, 20 to 30 μm, or 10 to 20 μm. The smaller the distance between adjacent two of the LED chips (110L1-110L3), the better the resolution of the display panels due to miniaturization of the LED device 100. When used in lighting application, reducing the distance between adjacent two of the LED chips (110L1-110L3) allows the ratio of chip surface area to device area increase, leading to a smaller device dimension, which is particularly preferable in CSP (chip scale package) application Referring again to FIGS. 1, 2, 3(A), the detailed structure of one of the LED chips (110L1-110L3) is described below. The LED chip (110L1-110L3) is a flip-chip LED, and includes a light-transmissible substrate 1110 (which may be omitted according to practical requirements), a first-type semiconductor layer 1111 that is connected to the light-transmissible substrate 1110, a light-emitting layer 1112 that is connected to the first-type semiconductor layer 1111, and a second-type semiconductor layer 1113 that is connected to the light-emitting layer 1112. The first-type and second-type semiconductor layers 1111, 1113 may be a p-type layer and a n-type layer, respectively, and may each be represented by $Al_xIn_yGa_{(1-x-y)}N$, wherein $0 \leq x \leq 1$, $0 \leq y \leq 1$, and $0 \leq x+y \leq 1$. Alternatively, each of the first-type and second-type semiconductor layers 1111, 1113 may be GaAs-based or GaP-based. The light-emitting layer 1112 may be a multiple quantum well structure that has a plurality of alternatingly stacked quantum well layers and quantum barrier layers, such as InGaN/GaN structure, GaN/AlGaN structure, GaAs/AlGaAs structure, InGaP/GaP structure, or GaP/AlGaP structure. The first electrode 1121 of the electrode assembly 1120 is electrically connected to the first-type semiconductor layer 1111, and the second electrode 1122 of the electrode assembly 1120 is electrically connected to the second-type semiconductor layer 1113.

Figure 3B:
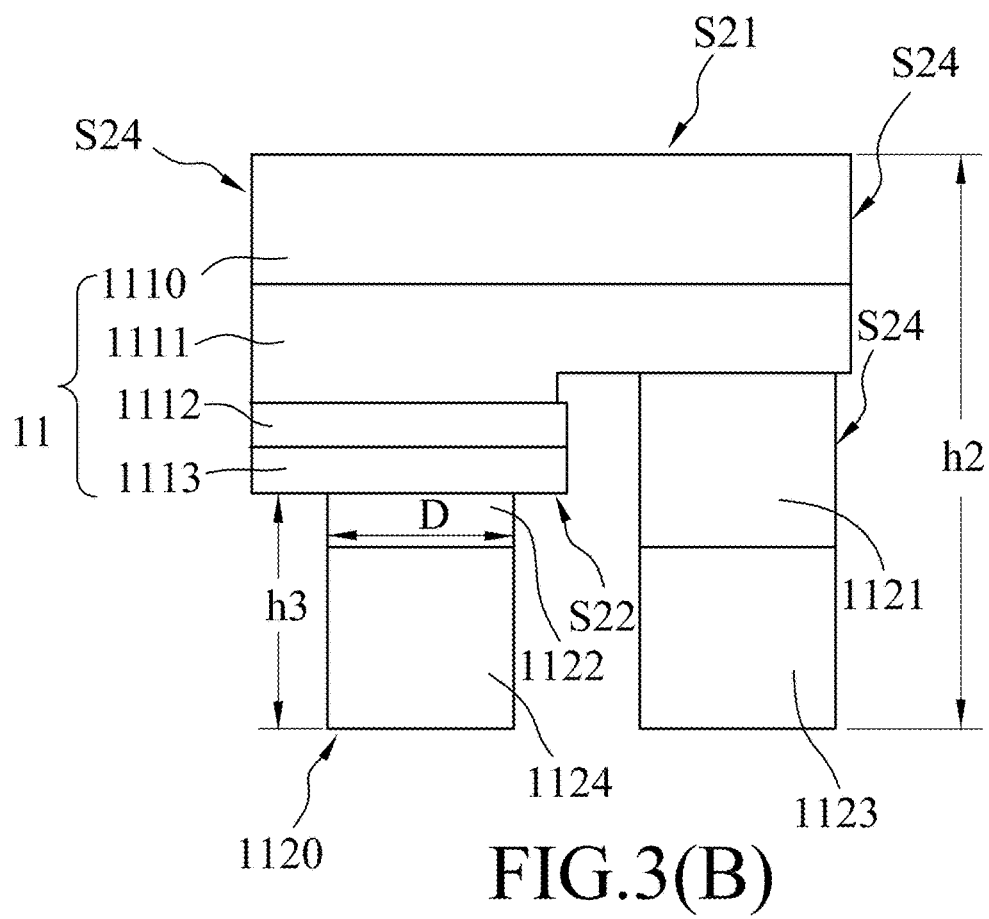
FIG. 3(B) is a schematic side view of an alternative configuration of the LED chip of the embodiment.

Referring further to FIG. 3(B), alternatively, the LED chip (110L1-110L3) may further include two thickening layers 1123, 1124 that are made of electrically conductive material and that are fixed and surrounded by the encapsulating layer 120. The thickening layer 1123 is connected between the first electrode 1121 and the electric circuit layer assembly 130, and the thickening layer 1124 is connected between the second electrode 1122 and the electric circuit layer assembly 130 to increase the thickness of the first and second electrodes 1121, 1122. A height (h3) of the second electrode 1122 and the thickening layer 1124 may be greater than 5 μm. In certain embodiments, the height (h3) may range from 5 to 500 μm. The thickening layers 1123, 1124 may be formed by electroplating, electroless plating, or printing, and may be made of electrically conductive metals, such as Cu, $Cu_xW$, etc. The thickening layers 1123, 1124 increases the side surface (S24) of the LED chip (110L1-110L3) so as to increase contact surface of the LED chip (110L1-110L3) with the encapsulating layer 120, and the thickening layers 1123, 1124 allow the LED chip (110L1-110L3) to form a nail-like structure that is embedded in the encapsulating layer 120 so that the LED chip (110L1-110L3) can be better encapsulated by the encapsulating layer 120. A ratio of a width (D) of the second electrode 1122 to the height (h3) may be larger than ½, such as 1. In certain embodiments, the height (h3) may range from 30 to 150 μm, 30 to 100 μm, 30 to 50 μm, or 80 to 120 μm, but is not limited thereto.

When the LED device 100 is used in a display panel, the LED device 100 may further include a black material layer 170 that covers the side surface (S24) for increasing contrast ratio of the display panel. In certain embodiments, the encapsulating layer 120 is dark-colored. In certain embodiments, the LED device 100 further includes a light-transmissible coarse layer 180 that is disposed on the first surface (S21) of each of the LED chips (110L1-110L3) for inducing light scattering to reduce glare of the display panel. The light-transmissible roughened layer may be made of a matte material having multiple small particles.

The light transmittance of the encapsulating layer 120 is not greater than 50%. In certain embodiments, the light transmittance of the encapsulating layer 120 is less than 30%. In certain embodiments, the light transmittance of the encapsulating layer 120 ranges from 5% to 20%. In certain embodiments, the encapsulating layer 120 is opaque. In this embodiment, the encapsulating layer 120 is formed in such a manner that the first surface (S21) of each of the LED chips (110L1-110L3) is exposed from the encapsulating layer 120 such that the LED chips (110L1-110L3) are able to emit light from the first surface (S21), and that the second surface (S32) of the electric circuit layer assembly 130 is exposed from the encapsulating layer 120 for electrically connecting with other components.

Figure 4:
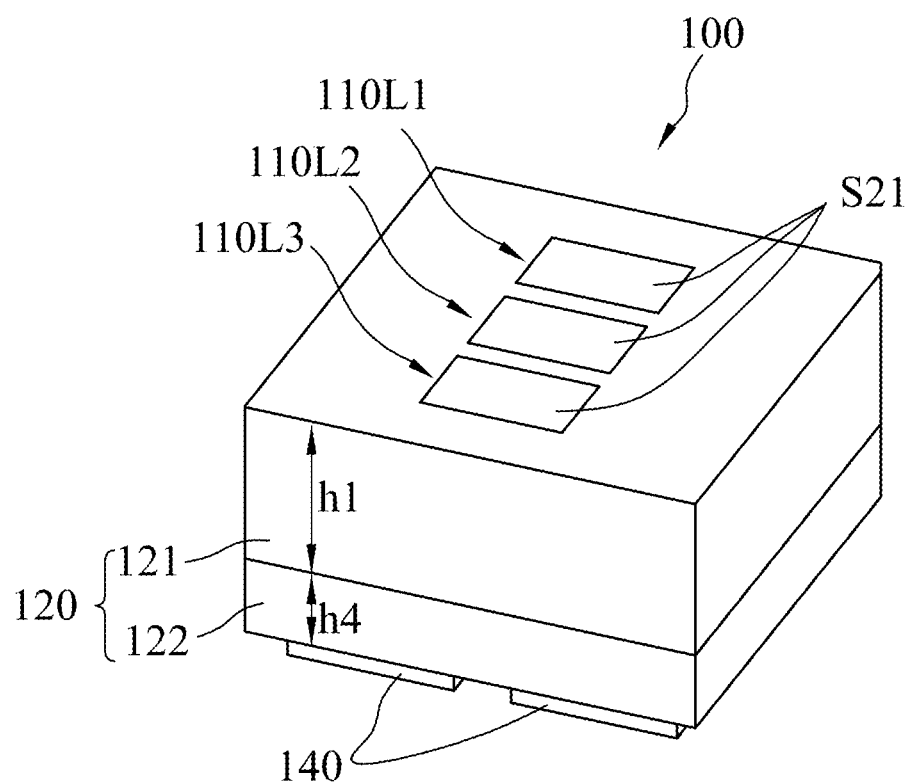
FIG. 4 is another perspective view of the embodiment with small package size.

Referring further to FIG. 4, in this embodiment, the encapsulating layer 120 is formed in a two-step manner, and includes a first encapsulating sub-layer 121 and a second encapsulating sub-layer 122. The first encapsulating sub-layer 121 covers and fixes the LED chips (110L1-110L3). Specifically, the first encapsulating sub-layer 121 covers the side surface (S24) of each of the LED chips (110L1-110L3) in such a manner that the first surface (S21) of each of the LED chips (110L1-110L3) is exposed from the first encapsulating sub-layer 121. A height (h1) of the first encapsulating sub-layer 121 substantially equals to a height (h2) of each of the LED chips (110L1-110L3). The second encapsulating sub-layer 122 covers the electric circuit layer assembly 130 in such a manner that at least a portion of the second surface (S32) of the electric circuit layer assembly 130 is exposed from the second encapsulating sub-layer 122. In this embodiment, a height (h4) of the second encapsulating sub-layer 122 substantially equals to a height (h5) of the electric circuit layer assembly 130.

The first encapsulating sub-layer 121 and the second encapsulating sub-layer 122 may be made of the same material or different materials. In applications such as the display panel, the first encapsulating sub-layer 121 and the second encapsulating sub-layer 122 are made of the same material such that the first and second encapsulating sub-layers 121, 122 are integrally formed as a monolithic piece. In certain embodiments, each of the first and second encapsulating sub-layers 121, 122 is made of epoxy resin or silica, and may include a colorant, allowing the encapsulating layer 120 to not only hold the LED chips (110L1-110L3) but also to suppress light interference among the LED chips (110L1-110L3).

In this embodiment, the encapsulating layer 120 has a coefficient of thermal expansion of less than 100 ppm/K, which is relatively comparable to that of the LED chips (110L1-110L3) for preventing crack or bending caused by mismatch between the coefficients of thermal expansion of the encapsulating layer 120 and the LED chips (110L1-110L3). In other embodiments, the coefficient of thermal expansion of the encapsulating layer 120 is less than 10 ppm/K.

Figure 13:
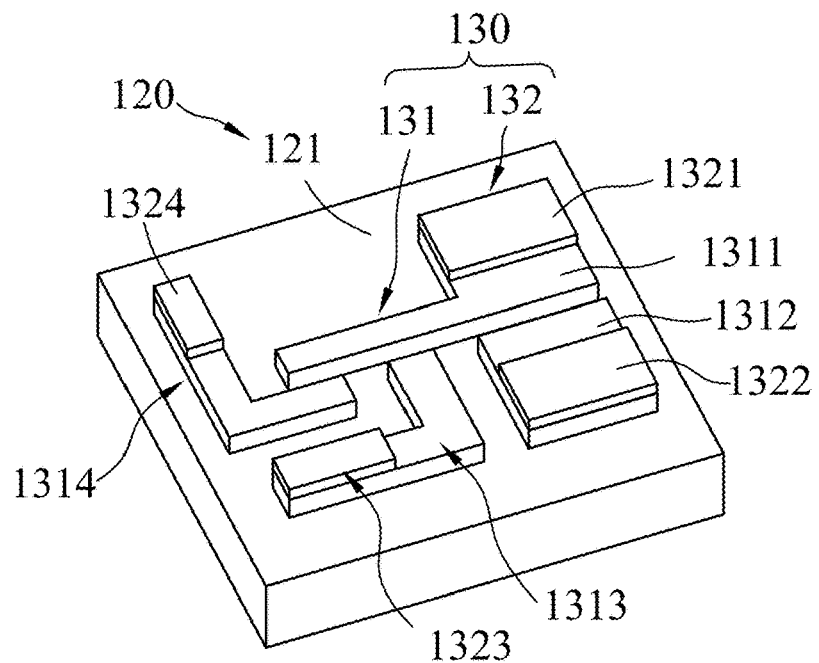
FIG. 13 is a perspective view showing yet another step of the method.

Referring to FIGS. 2, 13 and 18, the electric circuit layer assembly 130 is used for electrically connecting the LED chips (110L1-110L3) in series or in parallel according to practical requirements, and for electrically connecting the electrode assembly 1120 of each of the LED chips (110L1-110L3) to external electric connection, such as circuit boards. In this embodiment, the electric circuit layer assembly 130 includes a first electric circuit layer 131 that defines the first surface (S31) of the electric circuit layer assembly 130 and that is electrically connected to the first and second electrodes 1121, 1122 of the electrode assembly 1120 of a corresponding one of the LED chips (110L1-110L3) and a second electric circuit layer 132 that defines the second surface (S32) of the electric circuit layer assembly 130 and that is disposed on the first electric circuit layer 131 opposite to the corresponding one of the LED chips (110L1-110L3). In this embodiment, an area of the first surface (S31) of the electric circuit layer assembly 130 is greater than an area of the second surface (S32) of the electric circuit layer assembly 130. The first electric circuit layer 131 of the electric circuit layer assembly 130 includes a plurality of first electric circuit sub-layers (1311, 1312, 1313, 1314, 1315), and the second electric circuit layer 132 of the electric circuit layer assembly 130 includes a plurality of second electric circuit sub-layers (1321, 1322, 1323, 1324). A number of the LED chips (110L1-110L3) is A, a number of the first electric circuit sub-layers (1311-1315) is N, and a number of the second electric circuit sub-layers (1321-1324) is M, which satisfy the relationship of M≤N≤2A. That is, the number (N) of the first electric circuit sub-layers (1311-1315) is not less than the number (M) of the second electric circuit sub-layers (1321-1324). In this embodiment, the total number of the first and second electrodes 1121, 1122 of the three LED chips (110L1-110L3) is six, and the number of the first electric circuit sub-layers (1311-1315) is four. That is, the number of the first electric circuit sub-layers (1311-1315) is less than the number of the first and second electrodes (1121, 1122) of the LED chips (110L1-110L3). In certain embodiments, when the number of the LED chips (110L1-110L3) is A, the number of the first electric circuit sub-layers (1311-1315) is A+1, in which one of the first electric circuit sub-layers (1311-1315) is electrically connected to the first electrode 1121 of each of the LED chips (110L1-110L3) and the remainder of the first electric circuit sub-layers (1311-1315) are each electrically connected to the second electrode 1122 of a corresponding one of the LED chips (110L1-110L3). When the number of the first electric circuit sub-layers (1311-1315) is equal to the number of the second electric circuit sub-layers (1321-1324) and each of the second electric circuit sub-layers (1321-1324) is disposed on a respective one of the first electric circuit sub-layers (1311-1315), an area of a projection of the first electric circuit layer 131 of the electric circuit layer assembly 130 on the encapsulating layer 120 may be greater than an area of a projection of the second electric circuit layer 132 of the electric circuit layer assembly 130 on the encapsulating layer 120, such that the projection of the second electric circuit layer 132 of the electric circuit layer assembly 130 on the encapsulating layer 120 may lie within the projection of the first electric circuit layer 131 of the electric circuit layer assembly 130 on the encapsulating layer 120, thereby an insulating layer is not required to be disposed between the first and second electric circuit layers 131, 132. A distance between adjacent two of the second electric circuit sub-layers (1321-1324) is greater than a distance between adjacent two of the first electric circuit sub-layers (1311-1315). In this embodiment, the first electric circuit sub-layer 1311 is electrically connected to the first electrode 1121 of each of the LED chips (110L1-110L3). The first electric circuit sub-layer 1312 is electrically connected to the second electrode 1122 of the LED chip 110L1. The first electric circuit sub-layer 1313 is electrically connected to the second electrode 1122 of the LED chip 110L2. The first electric circuit sub-layer 1314 is electrically connected to the second electrode 1122 of the LED chip 110L3. The second electric circuit sub-layer 1321 is electrically connected to the first electric circuit sub-layer 1311 of the first electric circuit layer 131. The second electric circuit sub-layer 1322 is electrically connected to the first electric circuit sub-layer 1312 of the first electric circuit layer 131. The second electric circuit sub-layer 1323 is electrically connected to the first electric circuit sub-layer 1313 of the first electric circuit layer 131. The second electric circuit sub-layer 1324 is electrically connected to the first electric circuit sub-layer 1314 of the first electric circuit layer 131. The electric circuit layer assembly 130 serves as a precise electric interconnection among the LED chips (110L1-110L3).

Referring to FIGS. 2, 13, 17 and 18, in this embodiment, the bond pads (140P1-140P4) are formed on a lower surface (S12) of the encapsulating layer 120. The number of the bond pads (140P1-140P4) may be equal to the number of the second electric circuit sub-layers (1321-1324) of the second electric circuit layer 132. The bond pad 140P1 is electrically connected to the second electric circuit sub-layer 1321 of the second electric circuit layer 132. The bond pad 140P2 is electrically connected to the second electric circuit sub-layer 1322 of the second electric circuit layer 132. The bond pad 140P3 is electrically connected to the second electric circuit sub-layer 1323 of the second electric circuit layer 132. The bond pad 140P4 is electrically connected to the second electric circuit sub-layer 1324 of the second electric circuit layer 132. A total surface area of the bonds pads (140P1-140P4) is greater than that of the first surfaces (S21) of the LED chips (110L1-110L3). The number of the bond pads (140P1-140P4) is smaller than a total number of the first and second electrodes 1121, 1122 of the LED chips (110L1-110L3).

In certain embodiments, each of the second electric circuit sub-layers (1321-1324) of the second electric circuit layer 132 is rectangular-shaped and may be used for external electric connection such that the bonds pads (140P1-140P4) may be omitted.

By virtue of the electric circuit layer assembly 130, the LED device 100 of the present disclosure does not require wire bonding for electrical connection, thus reducing the overall size of the LED device 100 and increasing the ratio of the total surface area of the first surfaces (S21) (i.e., light exit surfaces) of the LED chips (110L1-110L3) to the area of the first surface (101). Moreover, the electric circuit layer assembly 130 allows the LED chips (110L1-110L3) to be electrically interconnected thereamong without requiring an extra circuit board, which may not be suitably applied with miniaturized LED device 100. Small size and high light exit surface ratio are particular popular in application of display panel. In certain embodiments, an area of the first surfaces (S21) of the LED chips (110L1-110L3) may be less than 30% of that of the first surface 101 of the LED device 100, such as 8.5%, or even less than 5% such as 2.8%, 1.125% or even lower. When the LED device 100 is used in lighting application, such percentage may be greater than 40% or even greater than 50%.

In one configuration schematically shown in FIGS. 1 and 2, each of the LED chips (110L1-110L3) is a 5 mil×9 mil chip, and the package size (i.e., the size of the first surface 101 of the LED device 100) is 1.0 mm×1.0 mm. In another configuration schematically shown in FIG. 4, each of the LED chips (110L1-110L3) is a 3 mil×5 mil chip, and the package size is 0.4 mm×0.4 mm. In yet another configuration schematically shown in FIG. 5, each of the LED chips (110L1-110L3) is a 3 mil×5 mil chip, and the package size is 0.3 mm×0.3 mm.

Figure 5:
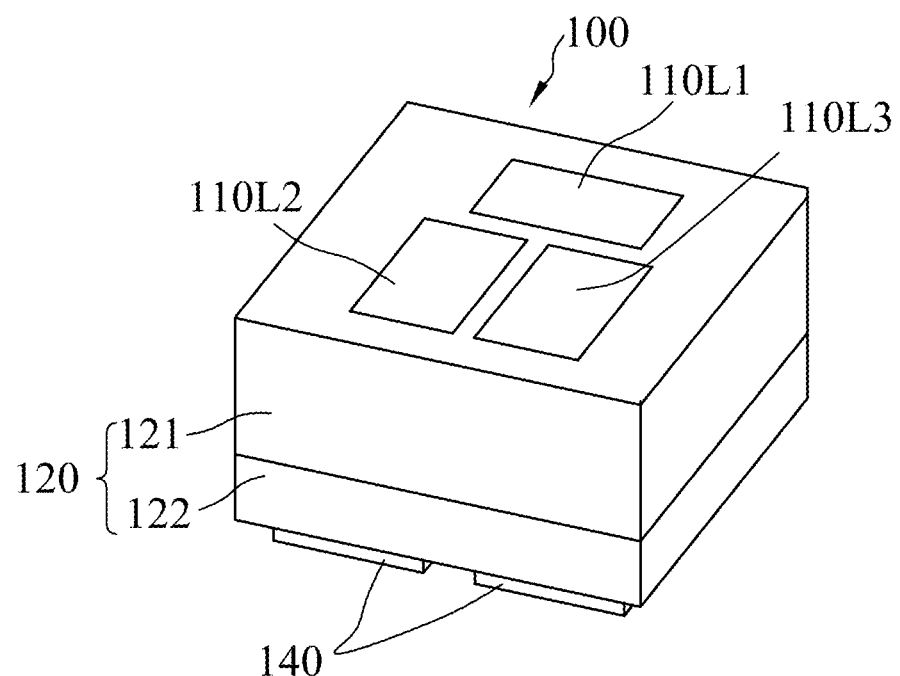
FIG. 5 is yet another perspective view of the embodiment with small package size.
Figure 6:
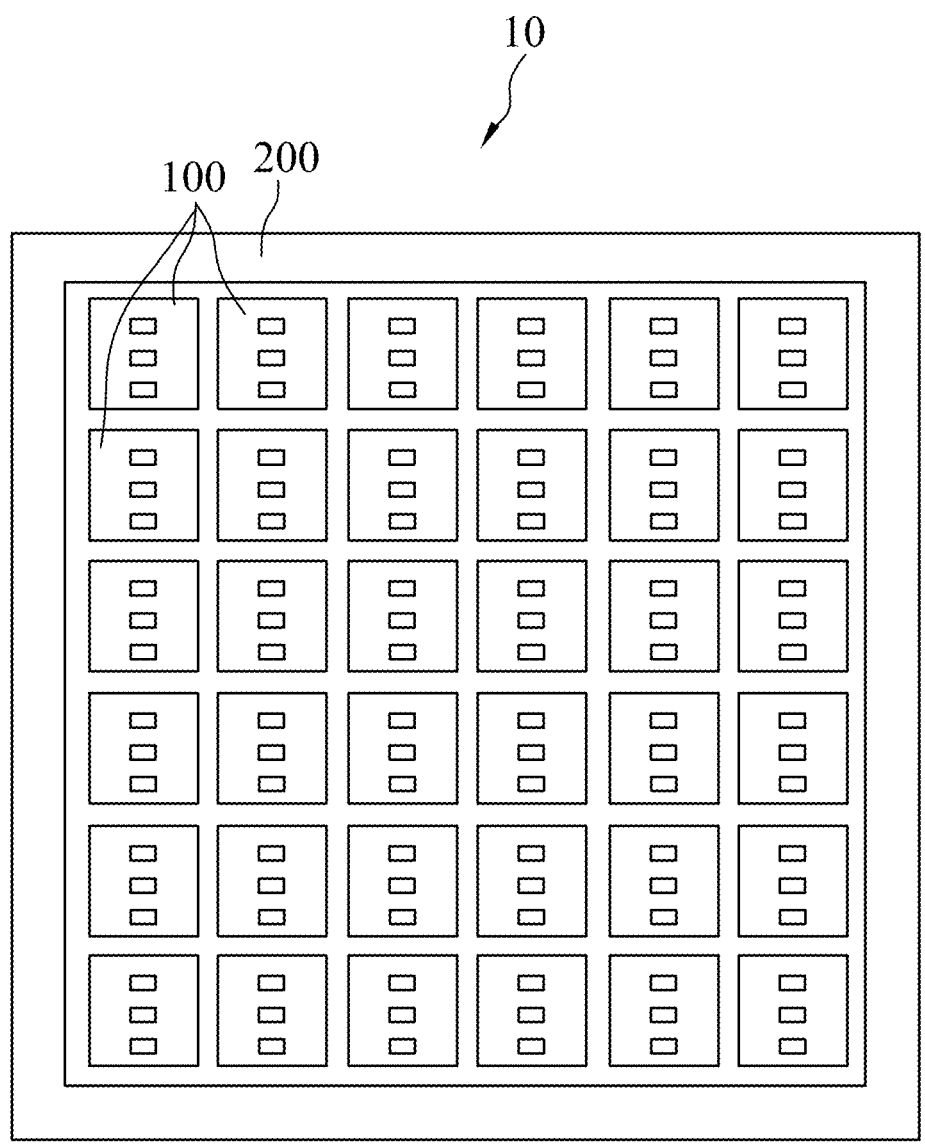
FIG. 6 is a schematic top view illustrating a plurality of the LED devices according to the present disclosure being used in a display panel.

FIG. 6 is a schematic top view illustrating a plurality of the LED devices 100 according to the present disclosure being used in a display panel 10. The display panel 10 includes a circuit board 200 for the LED devices 100 to be mounted thereto for selectively emitting red, green or blue lights. Each of the LED devices 100 serves as a pixel of the display panel 10. It should be noted that although the LED devices 100 are illustrated as a 6×6 array in FIG. 6, the number and arrangement of the LED devices 100 can be changed according to practical applications. In certain embodiments, the LED chips (110L1-110L3) of each of the LED devices 100 respectively emit red light, green light and blue light, thereby forming a RGB pixel group. Alternatively, the LED chips (110L1-110L3) of each of the LED devices 100 can form a CYM (cyan-yellow-magenta) pixel. In certain embodiments, the encapsulating layer 120 is made of epoxy resin or silica, and includes a black colorant. Therefore, the entire LED device 100, except the first surface (S21) of each of the LED chips (110L1-110L3), is black-colored, thereby reducing light interference among the LED chips (110L1-110L3) and enhancing contrast ratio of the display panel 10. It should be noted that, based on practical requirements, the encapsulating layer 120 may be made of light-transmissible material or opaque material. When each of the LED devices 100 shown in FIGS. 4 and 5 is used as a single pixel in the display panel 10, a distance between adjacent two of the pixels can be less than 1 mm.

Referring to FIGS. 7 to 18, a method for manufacturing the LED device 100 according to the present disclosure is described below.

Figure 8:
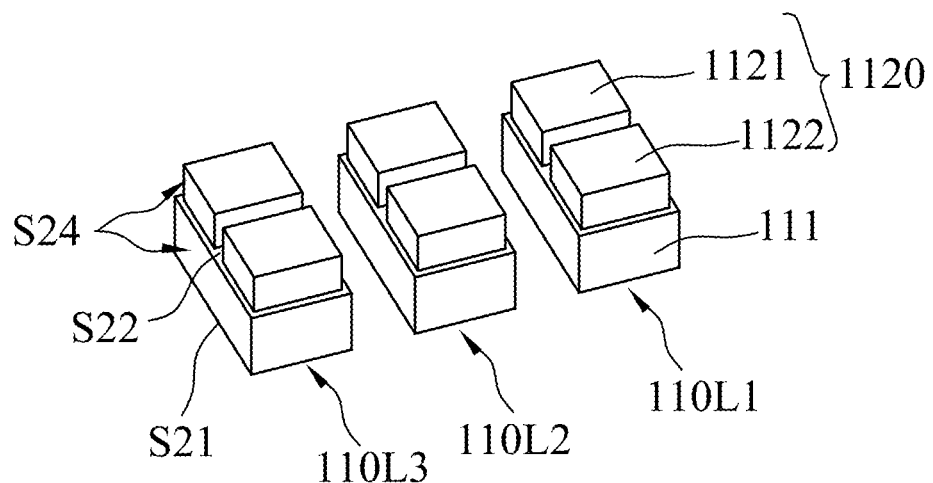
FIG. 8 is a perspective view showing a step of the method.

Referring to FIG. 8, the electrode assemblies 1120 of the LED chips (110L1-110L3) are arranged face up. In certain embodiments, the electrode assemblies 1120 of the LED chips (110L1-110L3) may be arranged face down. A substrate (not shown) may be provided for positioning the LED chips (110L1-110L3).

Figure 9:
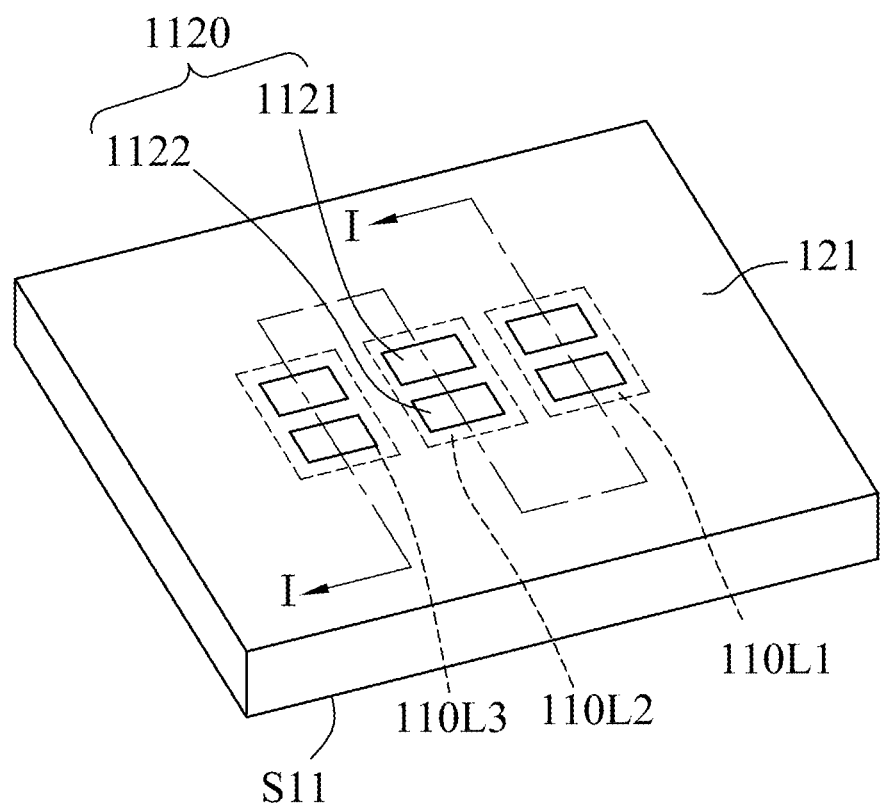
FIG. 9 is a perspective view showing another step of the method.
Figure 10:
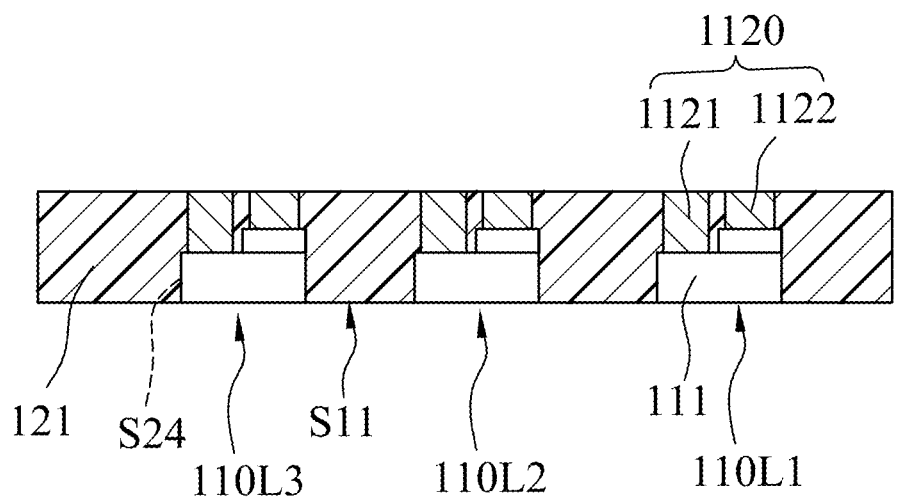
FIG. 10 is a sectional view taken along line I-I of FIG. 9.

Referring to FIGS. 9 and 10, the first encapsulating sub-layer 121 is formed to fix the LED chips (110L1-110L3) thereto. In this embodiment, the first encapsulating sub-layer 121 covers the side surface (S24) of each of the LED chips (110L1-110L3), and an upper surface (S11) of the first encapsulating sub-layer 121 opposite to the lower surface (S12) is flush with the first surface (S21) of each of the LED chips (110L1-110L3). In certain embodiments, the first encapsulating sub-layer 121 may be subjected to grinding or abrasive blasting until the first surface (S21) of each of the LED chips (110L1-110L3) are exposed so as to flush with the first encapsulating sub-layer 121. The height of the first encapsulating sub-layer 121 substantially equals to the height (h2) (see FIG. 3(A)) of each of the LED chips (110L1-110L3). In certain embodiments, the first encapsulating sub-layer 121 may be formed by silk-screen printing.

Figure 11:
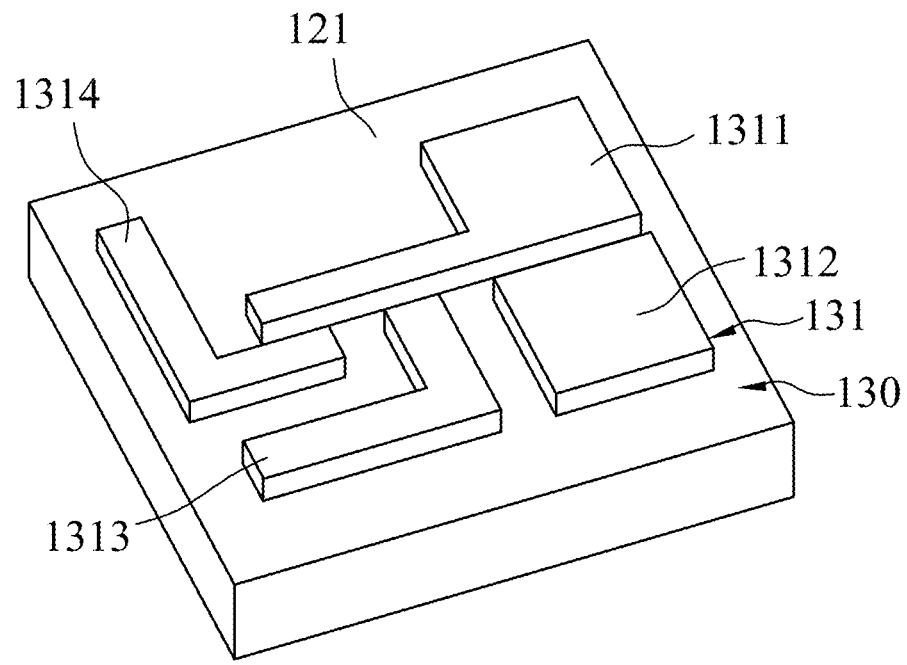
FIG. 11 is a perspective view showing yet another step of the method.
Figure 12:
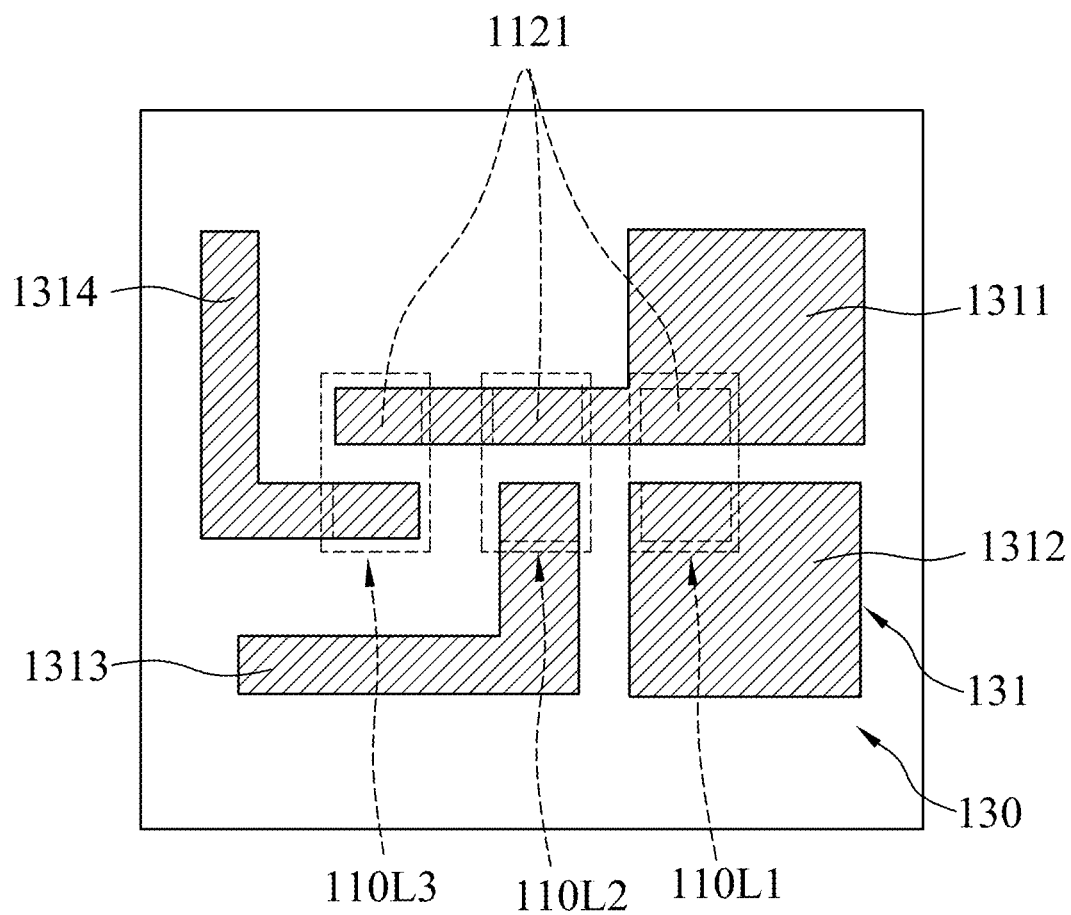
FIG. 12 is a schematic top view of FIG. 11.

Referring to FIGS. 10 to 12, the electric circuit layer assembly 130 is formed on the first encapsulating sub-layer 121, and is electrically connected to the electrode assemblies 1120 of the LED chips (110L1-110L3). The electric circuit layer assembly 130 may be single-layered or multi-layered.

Figure 14:
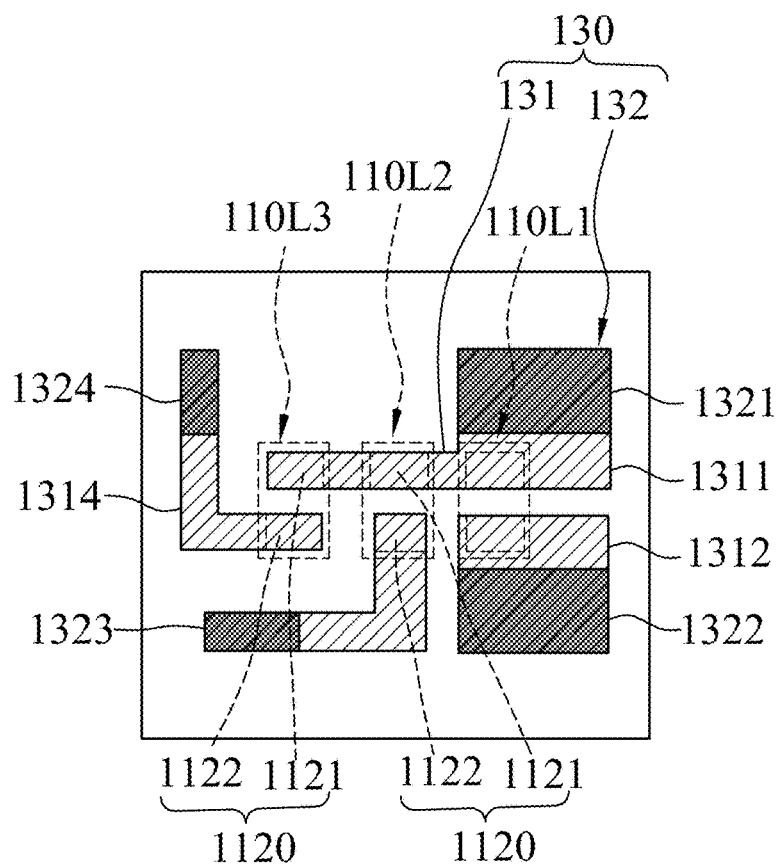
FIG. 14 is a schematic top view of FIG. 13.

In certain embodiments, when the electric circuit layer assembly 130 is multi-layered, each layer may have a pattern different from that of other layers. In this embodiment, the first electric circuit layer 131 is first formed on the first encapsulating sub-layer 121. Referring to FIGS. 13 and 14, the second electric circuit layer 132 is then formed on the first electric circuit layer 131. As described above, in this embodiment, the area of the projection of the first electric circuit layer 131 of the electric circuit layer assembly 130 on the encapsulating layer 120 may be greater than the area of the projection of the second electric circuit layer 132 of the electric circuit layer assembly 130 on the encapsulating layer 120, such that the projection of the second electric circuit layer 132 one the encapsulating layer 120 may lie within the projection of the first electric circuit layer 131 on the encapsulating layer 120. It should be noted that the pattern and number of each of the first and second electric circuit layers 131, 132 may be changed according to practical requirements. In certain embodiments, the second electric circuit layer 132 may have a pattern identical to that of the first electric circuit layer 131. In certain embodiments, a portion of the second electric circuit layer 132 may be disposed on the first electric circuit layer 131, and another portion of the second electric circuit layer 132 may be in direct contact with the first encapsulating sub-layer 121. In certain embodiments, the insulating layer (not shown) may be first formed on the first electric circuit layer 131, and then the second electric circuit layer 132 is formed on the insulating layer. The electric circuit layer assembly 130 may be formed by electroplating or electroless plating. In certain embodiments, the electric circuit layer assembly 130 may be made of Cu or $Cu_xW$, and may be patterned by photolithography techniques. In certain embodiments, the first electric circuit layer 131 may be made of Cu by electroplating.

Figure 15:
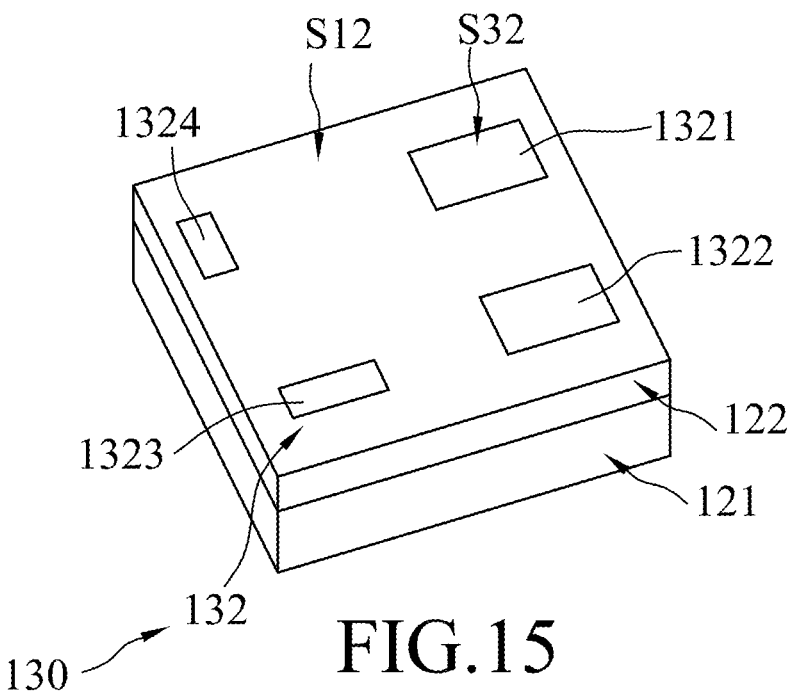
FIG. 15 is a perspective view showing yet another step of the method.
Figure 16:
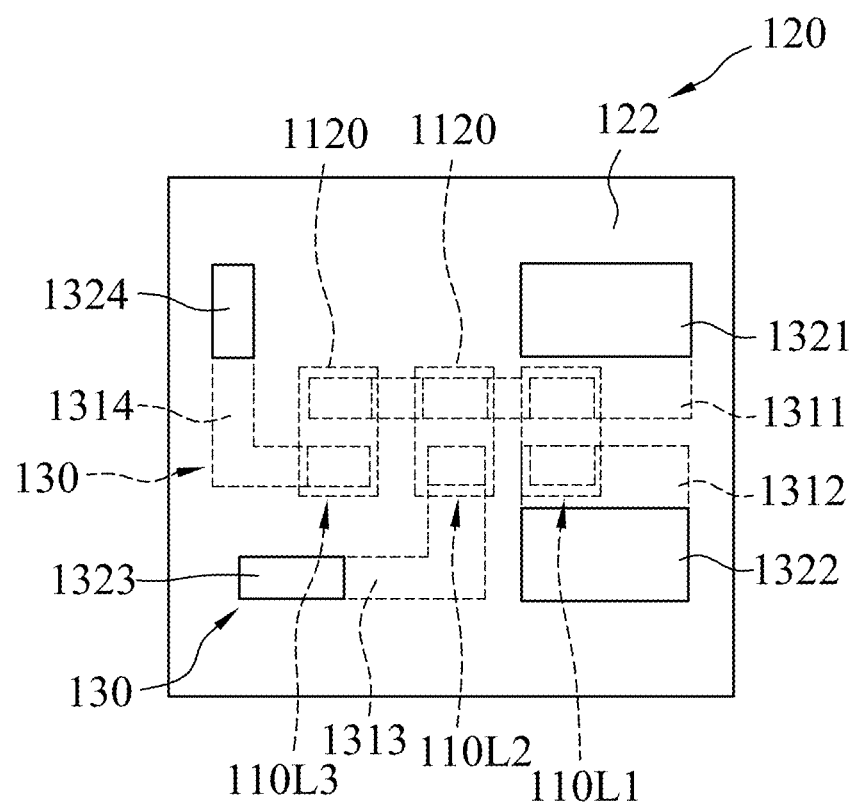
FIG. 16 is a schematic top view of FIG. 15.

Referring to FIGS. 15 and 16, the second encapsulating sub-layer 122 is formed on the first encapsulating sub-layer 121. In this embodiment, the second encapsulating sub-layer 122 covers the electrode assemblies 1120 of the LED chips (110L1-110L3) that are exposed from the first encapsulating sub-layer 121 and the electric circuit layer assembly 130, a bottom surface of the first electric circuit layer 131 which is not covered by the second electric circuit layer 132, a side surface of the first electric circuit layer 131, and a side surface of the second electric circuit layer 132, in such a manner that a bottom surface of the second electric circuit layer 132 (i.e., the second surface (S32) of the electric circuit layer assembly 130) is exposed from the second encapsulating sub-layer 12 and that the second surface (S32) is flush with a bottom surface of the second encapsulating sub-layer 122 (i.e., the lower surface (S12) of the encapsulating layer 120). In other words, the height (h4) of the second encapsulating sub-layer 122 (see FIG. 4) equals to the height of the electric circuit layer assembly 130. In this embodiment, the second encapsulating sub-layer 122 is formed by compression molding, followed by grinding or abrasive blasting to thin the second encapsulating sub-layer 122 until the second surface (S32) is exposed from the second encapsulating sub-layer 122.

Figure 17:
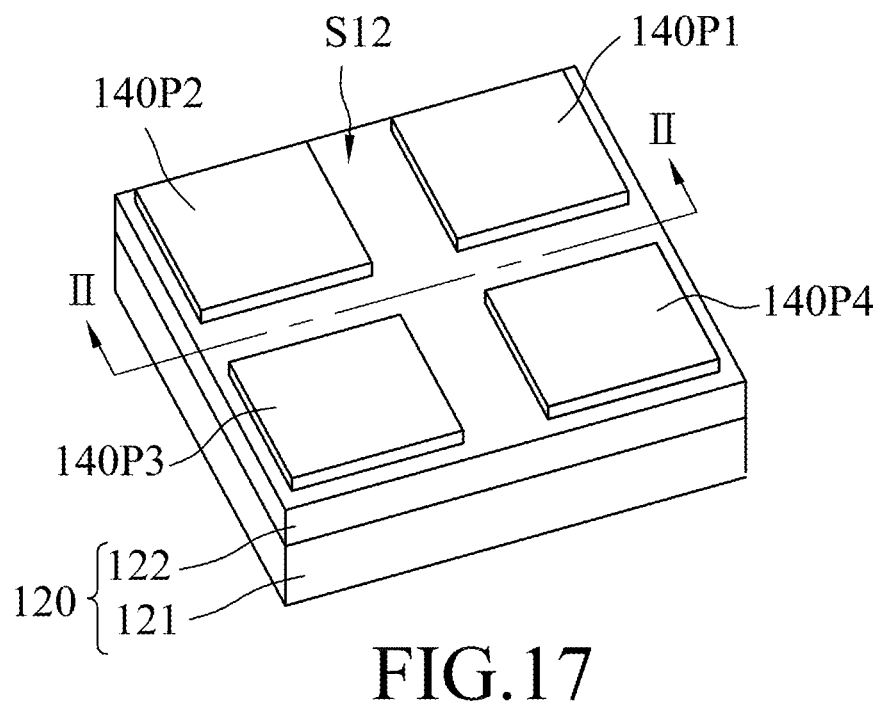
FIG. 17 is a perspective view showing still yet another step of the method.

Referring to FIGS. 17 and 18, the bond pads (140P1-140P4) are then formed on the lower surface (S12) of the encapsulating layer 120 to be electrically connected to the second surface (S32) (see FIG. 15) of the electric circuit layer assembly 130. The dimension of each of the bond pads (140P1-140P4) may be significantly larger than that of each of the first and second electrodes 1121, 1122 of each of the LED chips (110L1-110L3).

Conventionally, LED chips are bonded to a substrate by soldering technique that involves multiple steps, including applying solder to the substrate, aligning the LED chips with the substrate, and reflowing the solder to allow the LED chips to be mounted to the substrate. Alternatively, this embodiment utilizes the encapsulating layer 120 for enclosing the LED chips (110L1-110L3) and forming the electric circuit layer assembly 130 on the second surfaces (S22) of the LED chips (110L1-110L3), thereby eliminating possible alignment errors associated with solder applying and solder reflow used by the conventional technique. Therefore, the bonding accuracy of this embodiment can be improved, with the distance between adjacent two LED chips (110L1-110L3) being 10 µm or even smaller. Moreover, as mentioned in the foregoing, the electric circuit layer assembly 130 may be formed by photolithography technique so as to precisely connect the LED chips (110L1-110L3) together. Therefore, wire bonding is not needed, and since the LED chips (110L1-110L3) are precisely connected through the electric circuit layer assembly 130, sophisticated circuit design of the external circuit board is not required. According to this disclosure, the LED chips (110L1-110L3) with a dimension of 3 mil×5 mil can be used for making the LED device 100 with a package size of 0.3 mm×0.3 mm, or even smaller package size. When the LED device 100 is applied in display panel, the smaller the package size of the LED devices 100, the better the resolution of the display panel. When the LED chips (110L1-110L3) are applied in lighting, reducing the distance between adjacent two of the LED chips (110L1-110L3) can lead to increased surface area ratio of light exit surfaces of the LED chips (110L1-110L3).

Figure 19:
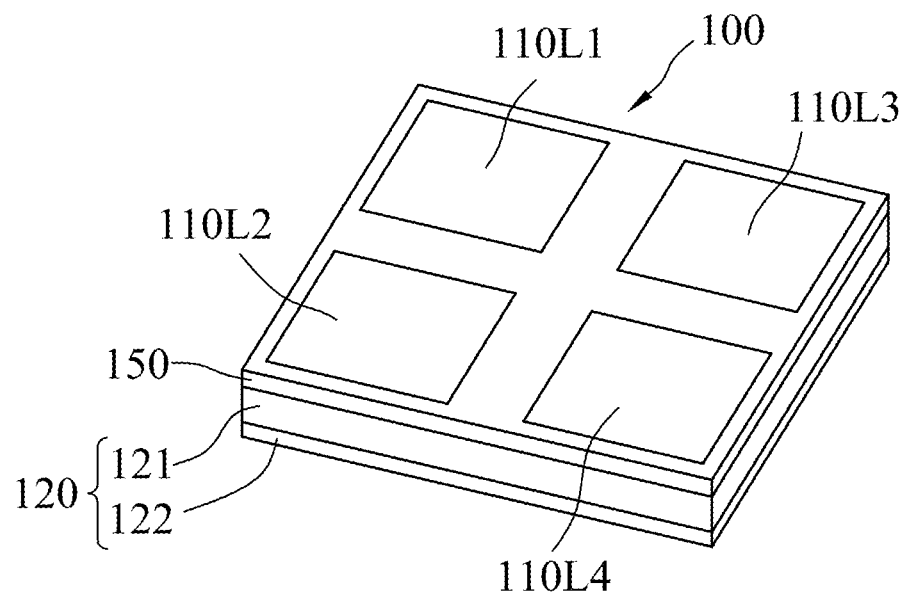
FIGS. 19 and 20 are perspective views illustrating a first variation of the embodiment.
Figure 20:
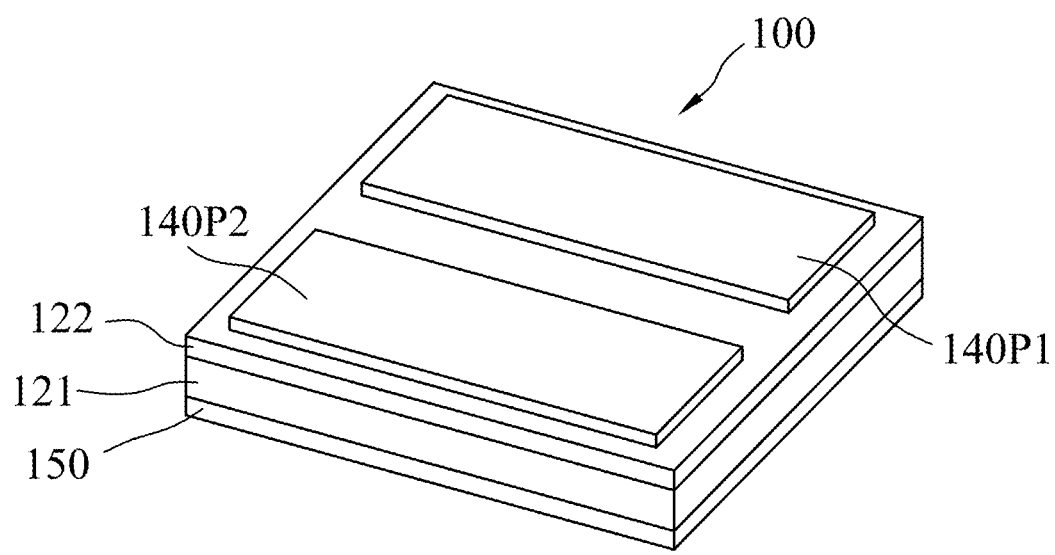

FIGS. 19 and 20 illustrate a first variation of the embodiment of the LED device 100 according to the present disclosure. In this variation, the LED device 100 includes four LED chips (110L1, 110L2, 110L3, 110L4), and a fluorescent powder layer 150 that surrounds light exit surfaces of the LED chips (110L1-110L4), rendering the first variation to be applicable in lighting devices. The LED chips (110L1-110L4) are packaged in a flip-chip manner, and each is capable of emitting ultraviolet light or blue light to collaborate with the fluorescent powder layer 150 so as to allow the LED device 100 to emit white light. The second encapsulating sub-layer 122 of the first variation may be made of a light-reflective material to increase the lighting efficiency of the LED device 100. The first encapsulating sub-layer 121 of this variation may include a plurality of particles for reflecting and/or scattering light emitted by the LED chips (110L1-110L4) so as to further improve the lighting efficiency of the LED device 100.

Figure 21:
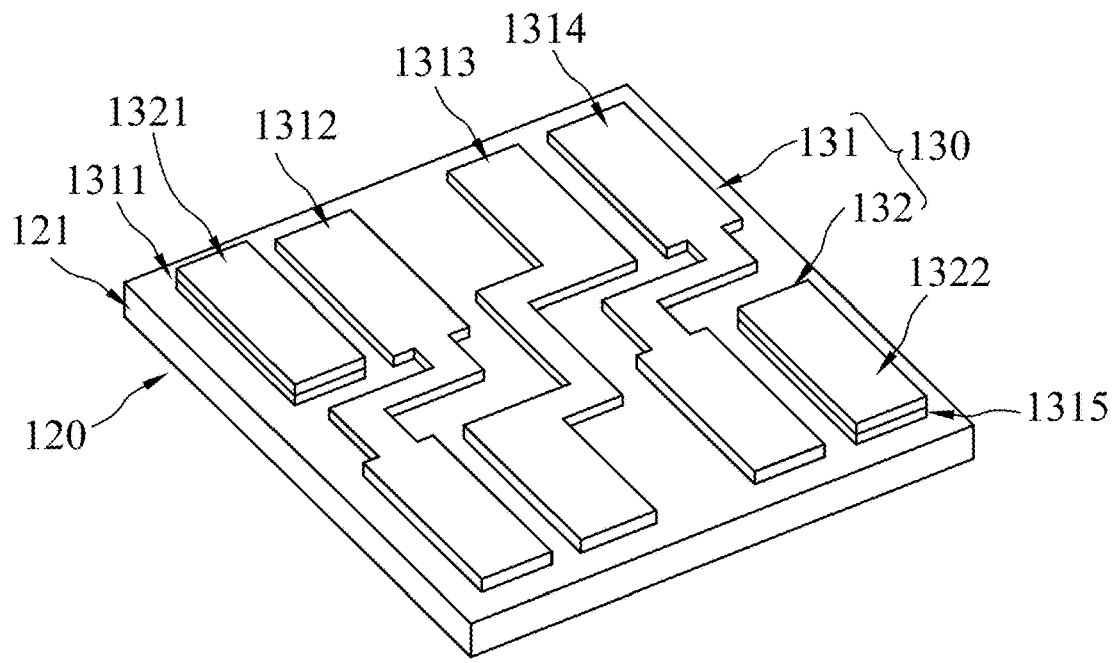
FIG. 21 is a perspective view showing an electric circuit layer assembly of the first variation.
Figure 22:
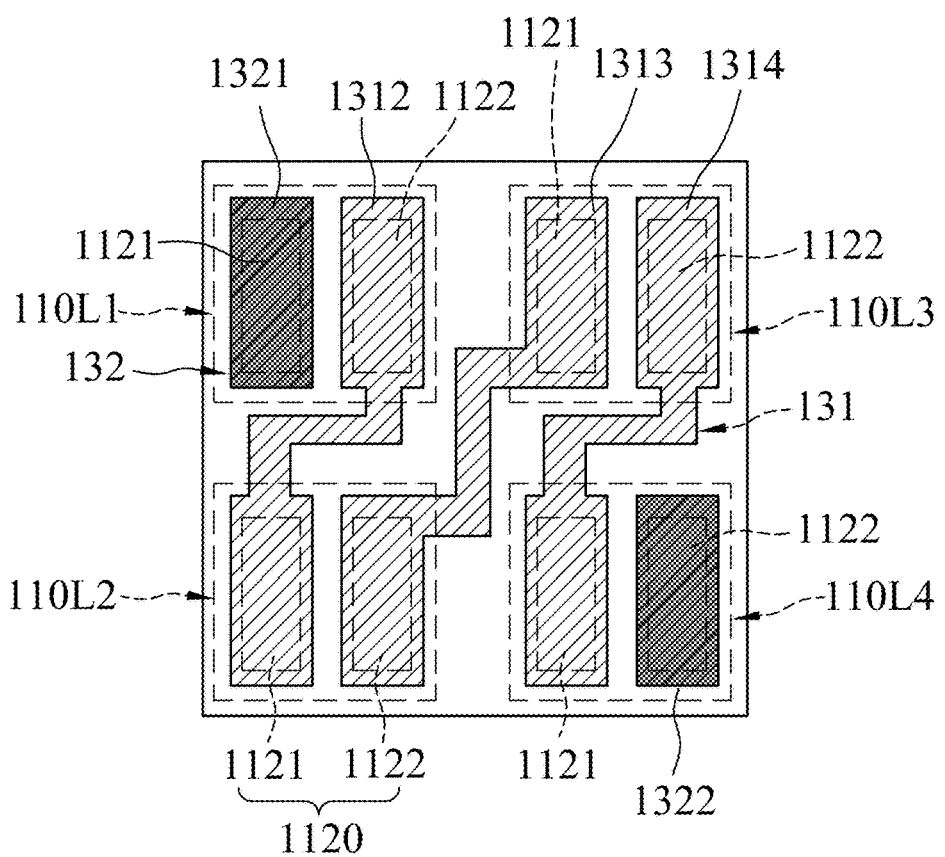
FIG. 22 is a schematic top view showing electrode assemblies and the electric circuit layer assembly of the first variation.

FIGS. 21 and 22 illustrate the electrode assemblies 1120 of the LED chips (110L1-110L4) and the electric circuit layer assembly 130 of the first variation. The LED chips (110L1-110L4) are connected in series through three of the first electric circuit sub-layers 1312, 1313, 1314. Specifically, the first electric circuit sub-layer 1311 is electrically connected to the first electrode 1121 of the LED chip 110L1. The first electric circuit sub-layer 1312 is electrically connected to the second electrode 1122 of the LED chip 110L1 and the first electrode 1121 of the LED chip 110L2. The first electric circuit sub-layer 1313 is electrically connected to the second electrode 1122 of the LED chip 110L2 and the first electrode 1121 of the LED chip 110L3. The first electric circuit sub-layer 1314 is electrically connected to the second electrode 1122 of the LED chip 110L3 and the first electrode 1121 of the LED chip 110L4. The first electric circuit sub-layer 1315 is electrically connected to the second electrode 1122 of the LED chip 110L4. The second electric circuit layer 132 of this variation includes two of the second electric circuit sub-layers 1321, 1322. The second electric circuit sub-layer 1321 of the second electric circuit layer 132 is disposed on and electrically connected to the first electric circuit sub-layer 1311 of the first electric circuit layer 131. The second electric circuit sub-layer 1322 of the second electric circuit layer 132 is disposed on and electrically connected to the first electric circuit sub-layer 1315 of the first electric circuit layer 131. The LED device 100 of this variation includes two of the bond pads 140P1, 140P2 that are respectively and electrically connected to the second electric circuit sub-layer 1321, 1322.

Figure 23:
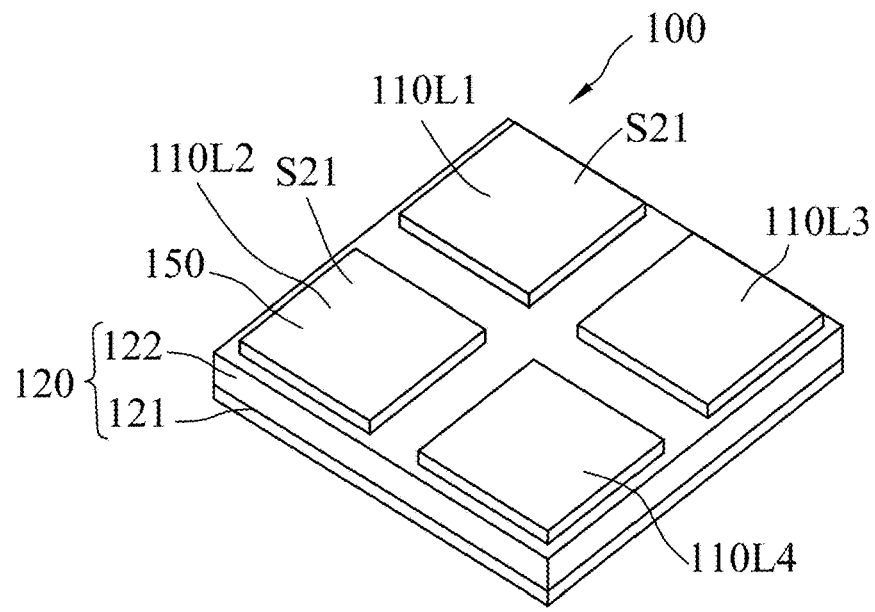
FIG. 23 is a perspective view showing the electric circuit layer assembly of a second variation.
Figure 24:
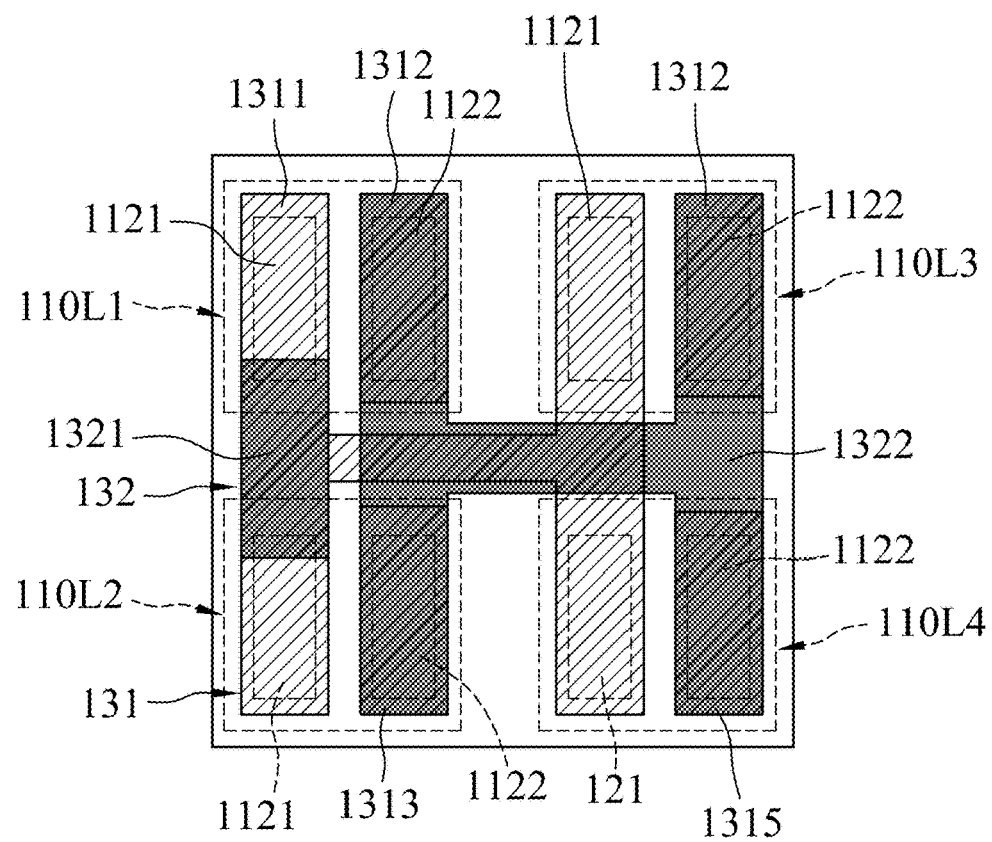
FIG. 24 is a schematic top view showing the electrode assemblies and the electric circuit layer assembly of the second variation.

FIGS. 23 and 24 illustrate a second variation of the embodiment of the LED device 100 according to the present disclosure, which has a structure similar to that of the first variation except for the differences described below. In the second variation, the first electric circuit sub-layer 1311 is electrically connected to the first electrodes 1121 of the LED chips (110L1-110L4). The first electric circuit sub-layers (1312-1315) are respectively and electrically connected to the second electrodes 1122 of the LED chips (110L1-110L4). The second electric circuit sub-layer 1321 is electrically connected to the first electric circuit sub-layer 1311. The second electric circuit sub-layer 1322 is electrically connected to the first electric circuit sub-layers (1312-1315), and is separated from the first electric circuit sub-layer 1311 by an electrically insulating layer (not shown) such that the LED chips (110L1-110L4) are electrically connected in parallel.

In the second variation, the fluorescent powder layer 150 partially covers the upper surface (S11) of the first encapsulating sub-layer 121 of the encapsulating layer 120. Specifically, the fluorescent powder layer 150 only covers the first surfaces (S21) of the LED chips (110L1-110L4).

Figure 25:
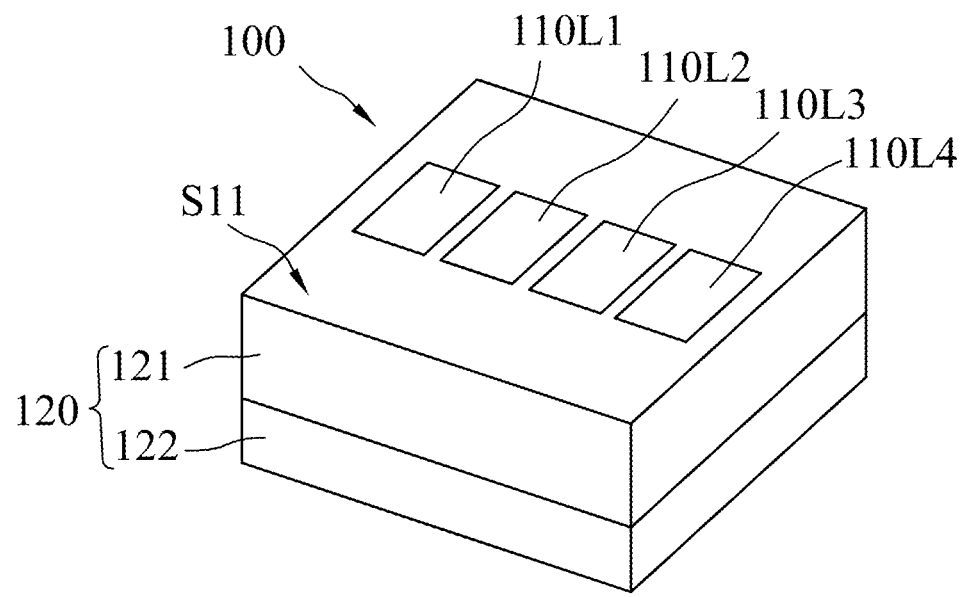
FIGS. 25 and 26 are perspective views of a third variation of the embodiment.
Figure 26:
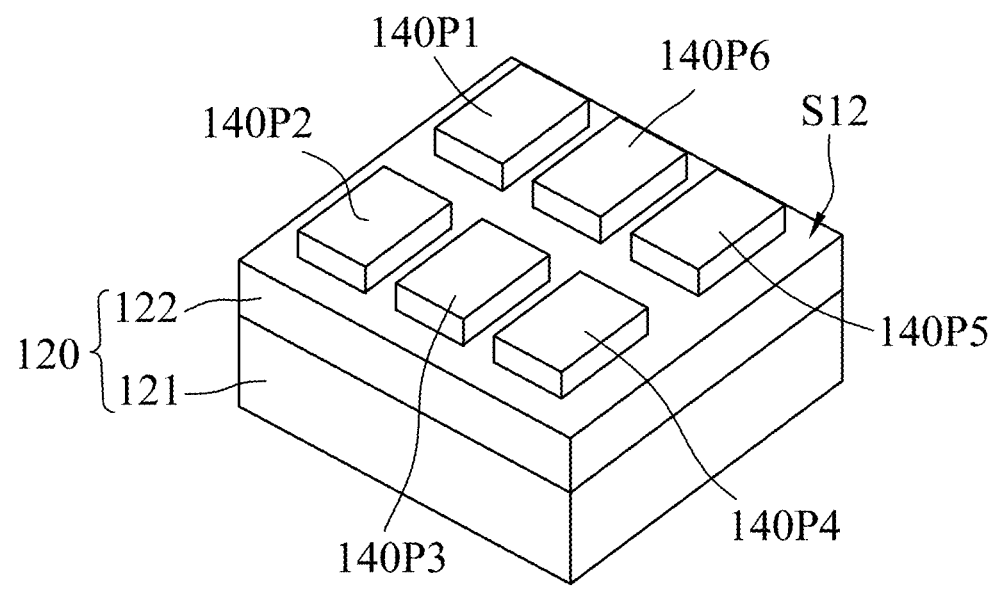
Figure 27:
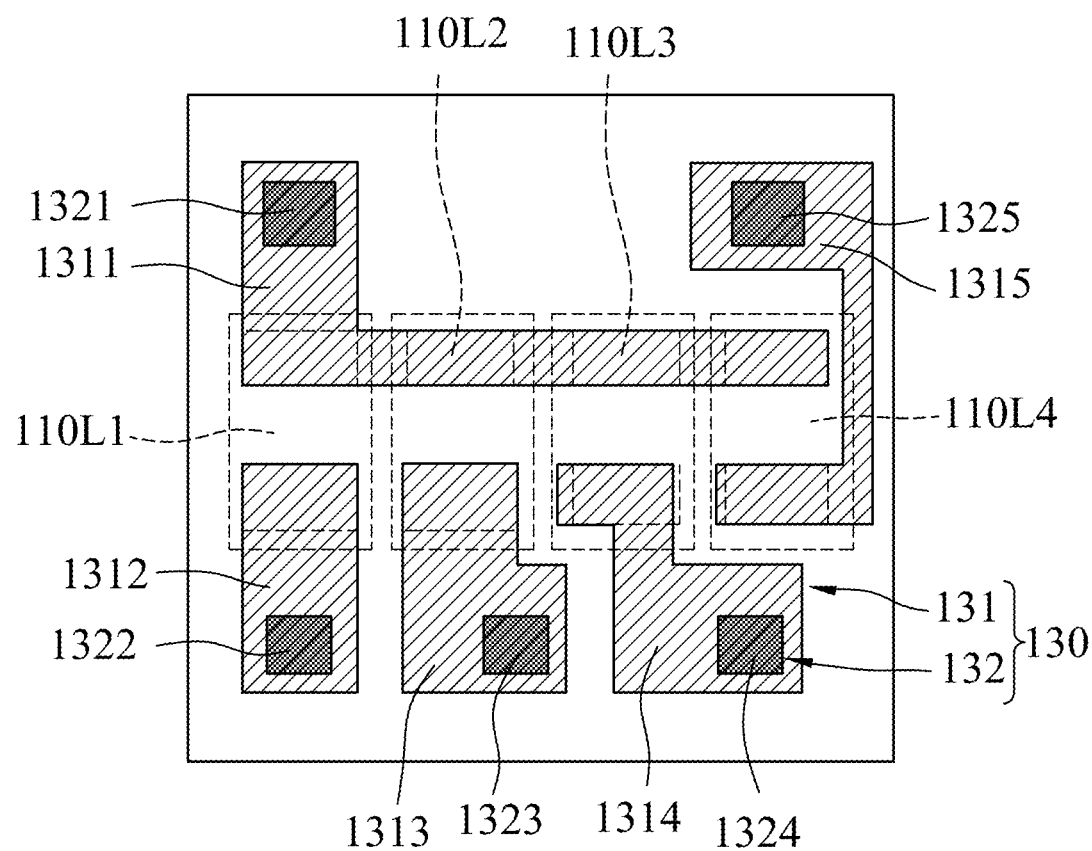
FIG. 27 is a schematic top view showing the electrode assemblies and the electric circuit layer assembly of the third variation.

FIGS. 25 to 27 illustrate a third variation of the embodiment of the LED device 100 according to the present disclosure. The third variation may be used in a display panel, and includes four of the LED chips (110L1-110L4), which respectively emit red light, green light, blue light and white light (i.e., a RGBW combination), thereby increasing the overall brightness of the display panel, which is a desirable trait for outdoor application.

In the third variation, the first electric circuit layer 131 includes five of the first electric circuit sub-layers (1311, 1312, 1313, 1314, 1315) and five of the second electric circuit sub-layers (1321, 1322, 1323, 1324, 1325). The first electric circuit sub-layer 1311 is electrically connected to the first electrodes 1121 of the LED chips (110L1-110L4). The first electric circuit sub-layers (1312-1315) are respectively and electrically connected to the second electrodes 1122 of the LED chips (110L1-110L4). The second electric circuit sub-layers (1321-1325) are respectively and electrically connected to the first electric circuit sub-layers (1311-1315). The third variation includes six of the bond pads (140P1, 140P2, 140P3, 140P4, 140P5, 140P6), five of which (i.e., 140P1-140P5) are respectively and electrically connected to the second electric circuit sub-layers (1321-1325), and the remainder of the bond pad (i.e., 140P6) is disposed on the lower surface (S12) of the encapsulating layer 120 and is not connected to electric circuit layer assembly 130. Alternatively, the bond pads (140P1-140P6) may be omitted, and the second electric circuit sub-layers (1321-1325) may be used for electrically connecting to the external circuit board.

Figure 28:
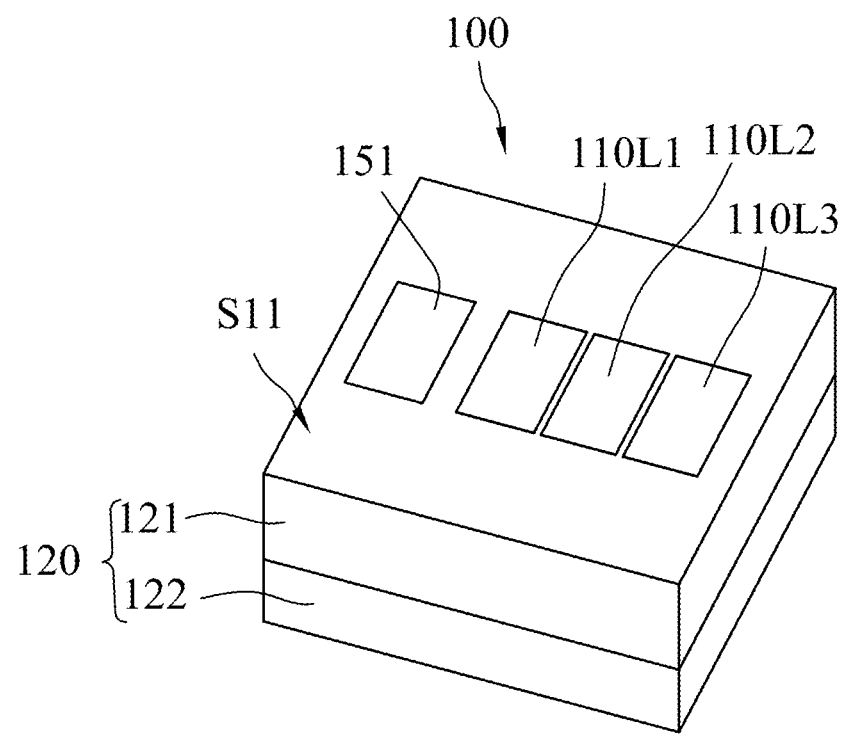
FIG. 28 is a perspective view of a fourth variation of the embodiment.
Figure 29:
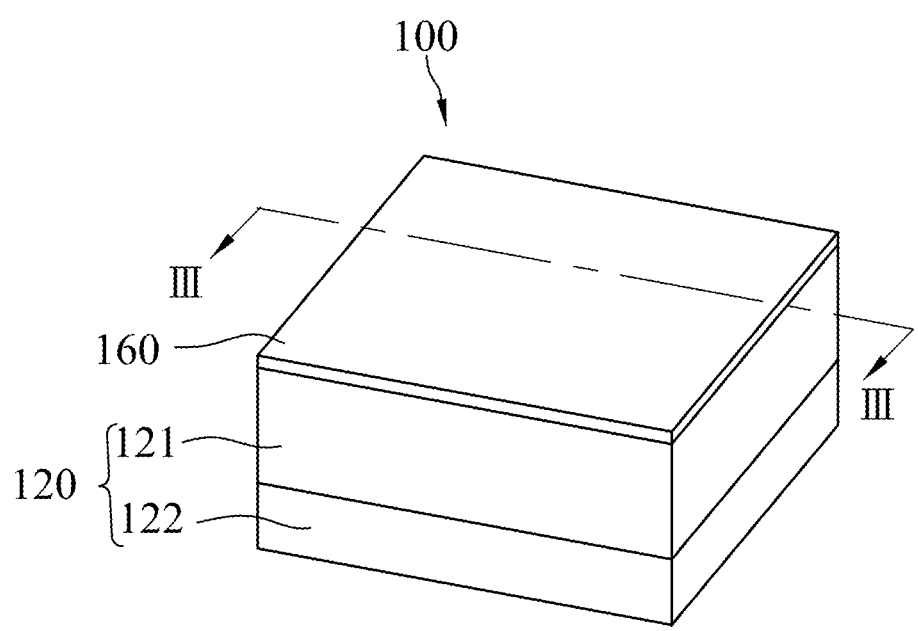
FIG. 29 is a perspective view showing the fourth variation including a protective layer.
Figure 30:
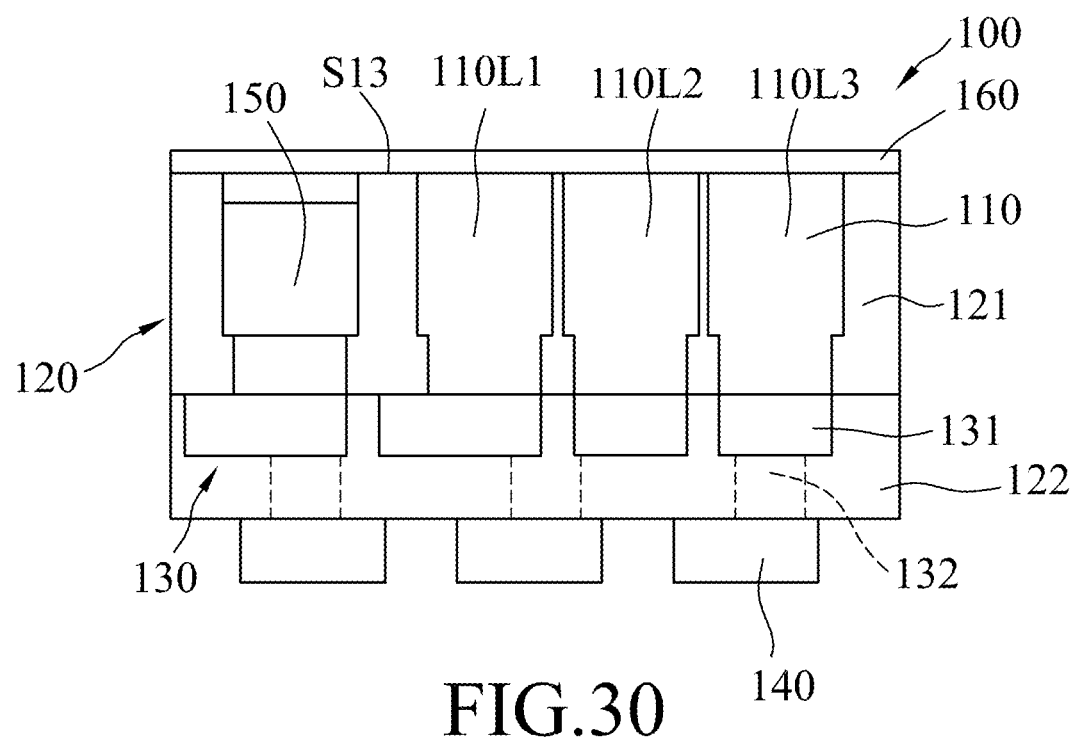
FIG. 30 is a schematic side view of the fourth variation and the protective layer thereof.

FIG. 28 illustrates a fourth variation of the embodiment of the LED device 100 according to the present disclosure, which may be used in a display panel. The LED device 100 of the fourth variation includes a sensor 151 that is fixed and surrounded by the encapsulating layer 120. In this variation, the LED device 100 includes three of the LED chips (110L1-110L3) which respectively emit red light, green light and blue light, and the sensor 151 is a photodiode which is spaced apart from the LED chips (110L1-110L3). The LED device 100 of the fourth variation may serve as a touch detector for the display panel. When the finger of a user touches the display panel, the lights emitted by the LED chips (110L1-110L3) are reflected by the finger and then are absorbed by the sensor 151 to form photocurrent, allowing the display panel to achieve touch sensing. It should be noted that the sensor 151 is not limited to photodiode, and may be changed according to practical requirements. Referring further to FIGS. 29 and 30, the LED device 100 may further include a protective layer 160, which may be light-transmissible to allow the lights emitted by the LED chips (110L1-110L3) to pass therethrough.

Figure 31:
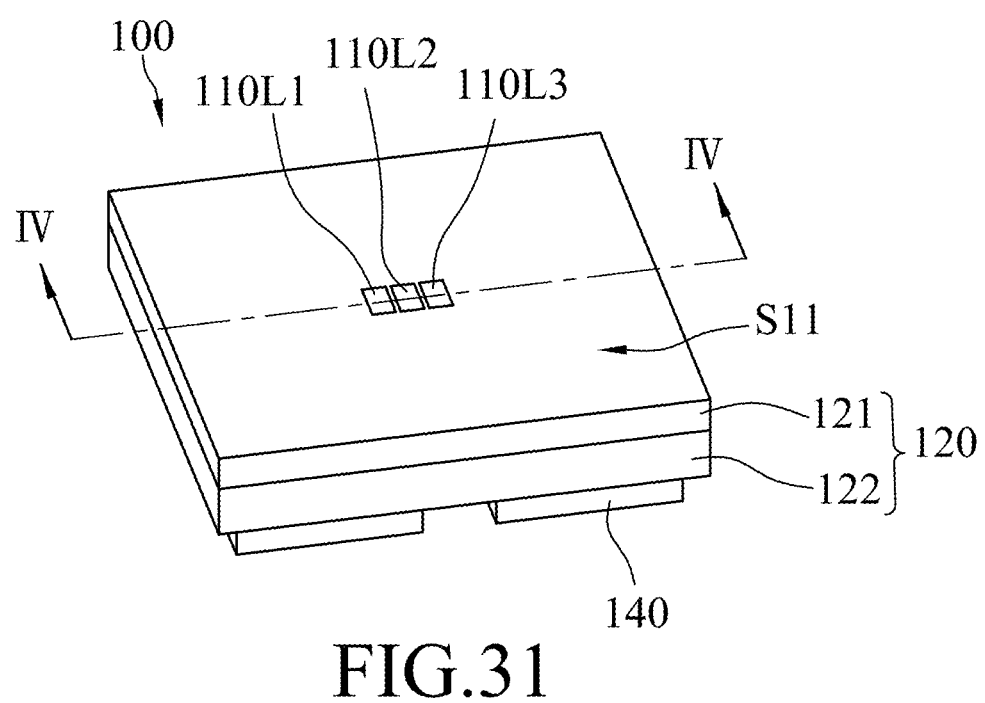
FIG. 31 is a perspective view of a fifth variation of the embodiment.
Figure 32:
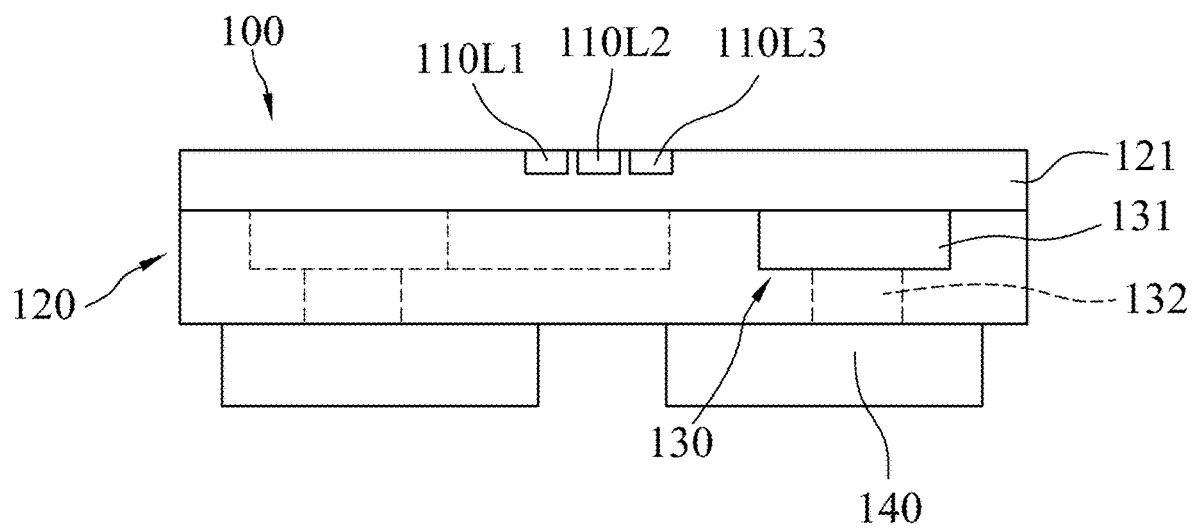
FIG. 32 is a schematic side view of the fifth variation.
Figure 33:
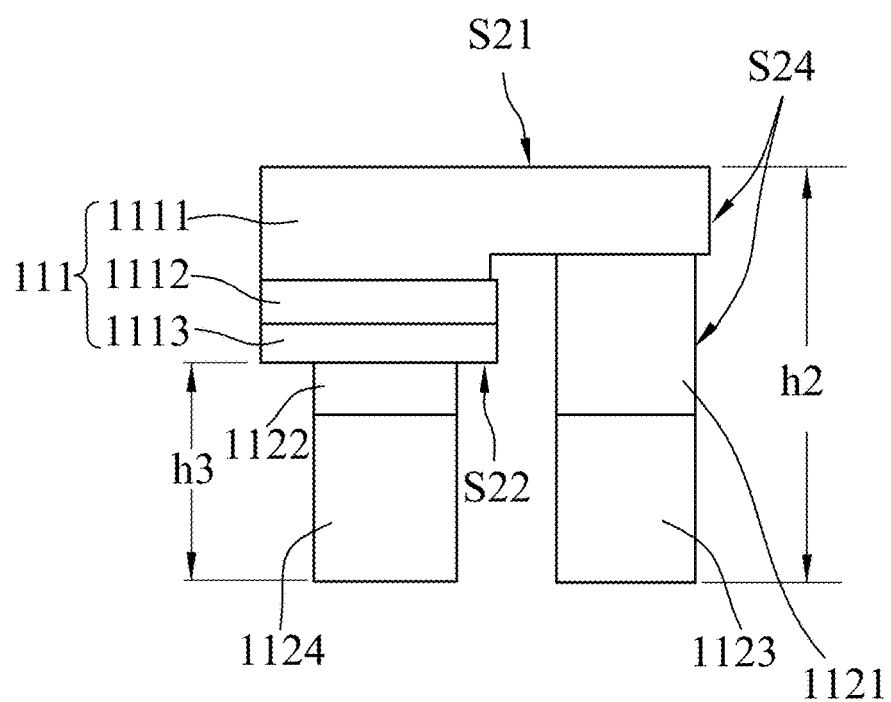
FIG. 33 is a side view of the LED chip of the fifth variation, in which a substrate as shown in FIG. 3(B) is omitted.

FIGS. 31 to 33 illustrate a fifth variation of the embodiment of the LED device 100 according to the present disclosure, which may be used in a display panel. The LED device 100 of the fifth variation includes three of the LED chips (110L1-110L3), which are micro-LED chips each having a dimension smaller than 100 μm. The surface area of the light exit surfaces of the LED chips (110L1-110L3) (i.e., the first surfaces (S21) of the LED chips (110L1-110L3)) occupies less than 5% of the surface area of the upper surface (S11) of the first encapsulating sub-layer 121 of the encapsulating layer 120, and the first encapsulating sub-layer 121 is made of a dark-colored material, such that the contrast ratio of the display panel is increased. In this variation, the size of each of the LED chips (110L1-110L3) is 30 μm×30 μm, and the package size of the LED device 100 is 0.4 mm×0.4 mm. The surface area of the first surfaces (S21) of the LED chips (110L1-110L3) occupies 1.125% of the surface area of the upper surface (S11) of the first encapsulating sub-layer 121 of the encapsulating layer 120. Referring further to FIG. 33, the micro-LED chip usually does not include the substrate 1110 as shown in FIG. 3(B).

Figure 34:
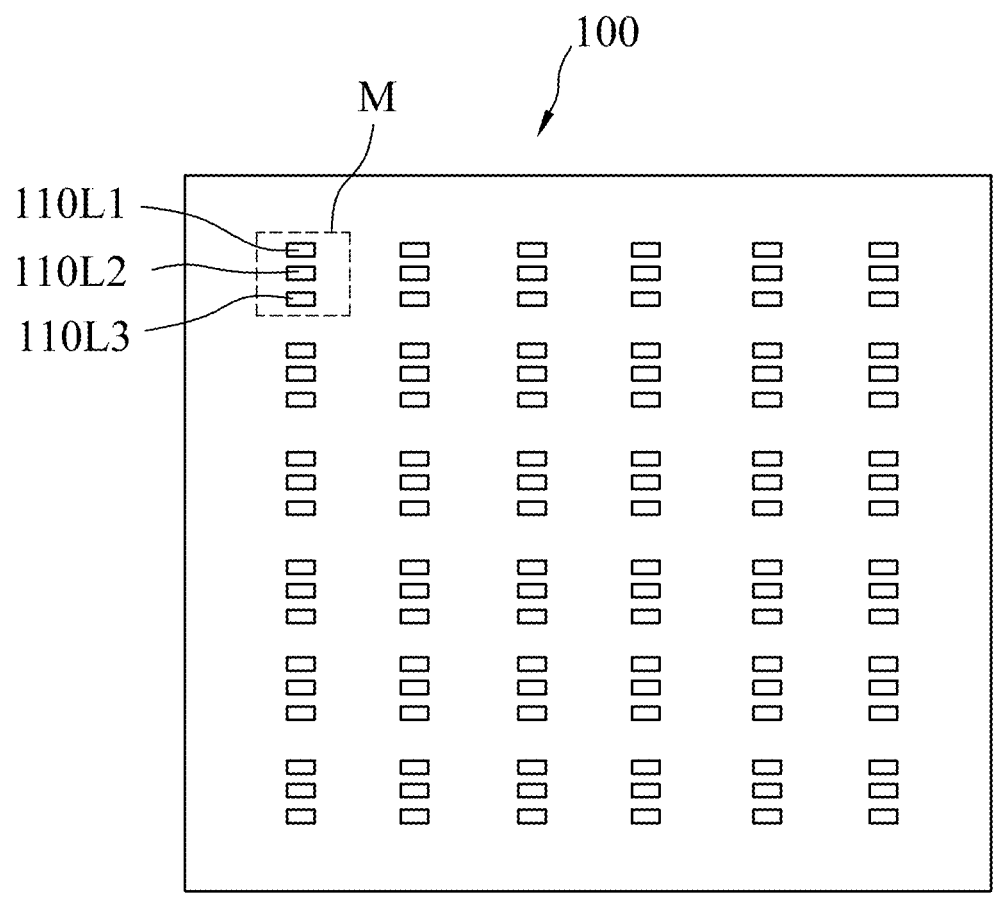
FIG. 34 is a schematic top view of a sixth variation of the embodiment.
Figure 35:
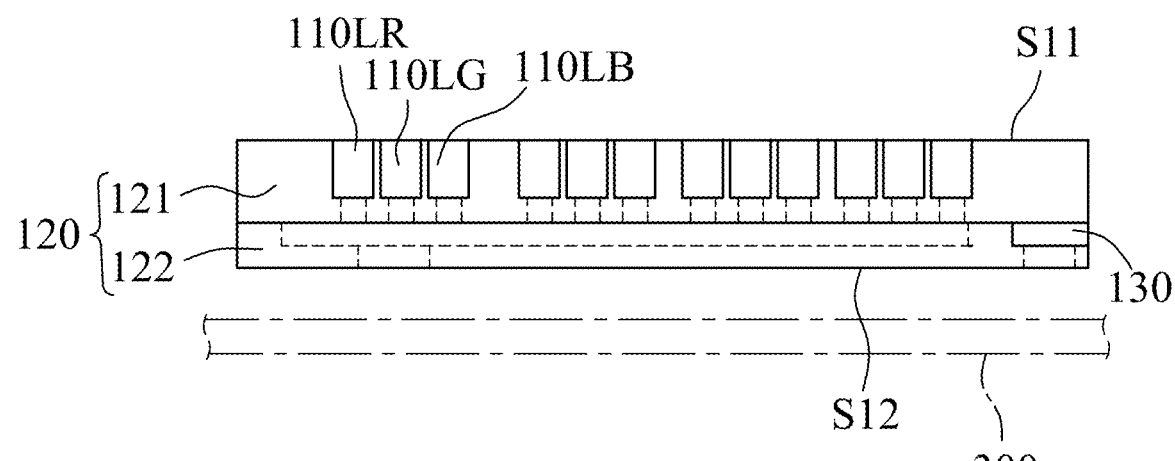
FIG. 35 is a schematic side view of the sixth variation.

FIGS. 34 and 35 illustrate a sixth variation of the embodiment of the LED device 100 according to the present disclosure, which may be used in a light-emitting apparatus in a display panel. The light-emitting apparatus includes a circuit board 300, and a plurality of the LED devices 100 (only one is shown in FIGS. 34 and 35) that are arranged on the circuit board 300. The LED chips (100L1-100L3) of each of the LED devices 100 are defined into at least one pixel. Alternatively, each of the LED devices 100 includes a plurality of chip groups (M), each of which includes three of the LED chips (100L1-100L3) that respectively emit red light, green light and blue light. Each of the chip groups (M) may be defined as a pixel of the display panel. A portion of the lower surface (S12) of the encapsulating layer 120 of each of the LED devices 100 may serve as a mounting area for microelectronic devices, such as a controller, a capacitance, etc., allowing the upper surface (S11) of the first encapsulating sub-layer 121 of the encapsulating layer 120 of the LED device 100 to serve only as the light exit surfaces of the LED chips (100L1-100L3) and allowing the lower surface (S12) of the encapsulating layer 120 of the LED device 100 to be connected to the microelectronic elements, thereby maximizing the light exit surfaces of the LED chips (100L1-100L3) and allowing the display panel to be used in a thin bezel monitor.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiment but is intended to cover various arrangements included within the spirit and scope of the broadest interpretation so as to encompass all such modifications and equivalent arrangements.

What is claimed is:

1. An LED device comprising:
    a plurality of LED chips, each of said LED chips having opposite first and second surfaces, and a side surface that is connected between said first and second surfaces, and including a semiconductor stack having a first-type semiconductor layer, a second-type semiconductor layer, and a light-emitting layer located between the first semiconductor layer and the second semiconductor layer, and an electrode assembly disposed on the semiconductor stack and including a first electrode and a second electrode, wherein the first electrode is electrically connected to the first semiconductor layer, and the second electrode is electrically connected to the second semiconductor layer;
    an electric circuit layer assembly disposed on said second surfaces of said LED chips, and having opposite first and second surfaces and a side surface that is connected between said first and second surfaces of said electric circuit layer assembly, said first surface of said electric circuit layer assembly being directly and electrically connected to said first and second electrodes of said electrode assembly;
    an encapsulating layer enclosing said LED chips and said electric circuit layer assembly in such a manner that at least a portion of said second surface of said electric circuit layer assembly is exposed from said encapsulating layer; and
    a plurality of bond pads that are disposed on said encapsulating layer and that are electrically connected to said electric circuit layer assembly,
    wherein a total surface area of said bond pads is greater than a total surface area of said first surfaces of said LED chips.

2. The LED device as claimed in claim 1, wherein said first surface of each of said LED chips is exposed from said encapsulating layer.

3. The LED device as claimed in claim 1, wherein an area of said first surface of said electric circuit layer assembly is greater than an area of said second surface of said electric circuit layer assembly.

4. The LED device as claimed in claim 1, wherein said electric circuit layer assembly includes a first electric circuit layer that defines said first surface of said electric circuit layer assembly and that is electrically connected to said first and second electrodes of said electrode assembly of a corresponding one of said LED chips, and a second electric circuit layer that defines said second surface of said electric circuit layer assembly and that is disposed on said first electric circuit layer opposite to the corresponding one of said LED chips.

5. The LED device as claimed in claim 4, wherein said encapsulating layer covers said second electric circuit layer in such a manner that said second surface of said electric circuit layer assembly is exposed from said encapsulating layer.

6. The LED device as claimed in claim 4, wherein an area of a projection of said first electric circuit layer of said electric circuit layer assembly on said encapsulating layer is greater than an area of a projection of said second electric circuit layer of said electric circuit layer assembly on said encapsulating layer.

7. The LED device as claimed in claim 4, wherein a projection of said second electric circuit layer of said electric circuit layer assembly on said encapsulating layer lies within a projection of said first electric circuit layer of said electric circuit layer assembly on said encapsulating layer.

8. The LED device as claimed in claim 4, wherein said first electric circuit layer of said electric circuit layer assembly includes a plurality of first electric circuit sub-layers, and said second electric circuit layer of said electric circuit layer assembly includes a plurality of second electric circuit sub-layers.

9. The LED device as claimed in claim 8, wherein a distance between adjacent two of said second electric circuit sub-layers is greater than a distance between adjacent two of said first electric circuit sub-layers.

10. The LED device as claimed in claim 8, wherein a number of said first electric circuit sub-layers is not less than a number of said second electric circuit sub-layers.

11. The LED device as claimed in claim 8, wherein a number of said first electric circuit sub-layers is less than a number of said first and second electrodes of said electrode assemblies of said LED chips.

12. The LED device as claimed in claim 8, wherein a number of said LED chips is A, a number of said first electric circuit sub-layers is N, a number of said second electric circuit sub-layers is M, and M≤N≤2A.

13. The LED device as claimed in claim 8, wherein one of said first electric circuit sub-layers is electrically connected to said first electrodes of said electrode assemblies of said LED chips, and the remainder of said first electric circuit sub-layers are respectively and electrically connected to said second electrodes of said electrode assemblies of said LED chips.

14. The LED device as claimed in claim 1, wherein said encapsulating layer is opaque.

15. The LED device as claimed in claim 1, further comprising a protective layer that is light-transmissible, and that is disposed on said first surface of each of said LED chips.

16. An LED device comprising:
    a plurality of LED chips, each of said LED chips having opposite first and second surfaces, and a side surface that is connected between said first and second surfaces, and including a semiconductor stack having a first-type semiconductor layer, a second-type semiconductor layer, and a light-emitting layer located between the first semiconductor layer and the second semiconductor layer, and an electrode assembly disposed on the semiconductor stack and including a first electrode and a second electrode, wherein the first electrode is electrically connected to the first semiconductor layer, and the second electrode is electrically connected to the second semiconductor layer;

an electric circuit layer assembly disposed on said second surfaces of said LED chips, and having opposite first and second surfaces and a side surface that is connected between said first and second surfaces of said electric circuit layer assembly, said first surface of said electric circuit layer assembly being directly and electrically connected to said first and second electrodes of said electrode assembly; and an encapsulating layer enclosing said LED chips and said electric circuit layer assembly in such a manner that at least a portion of said second surface of said electric circuit layer assembly is exposed from said encapsulating layer, wherein an area of said first surface of said electric circuit layer assembly is greater than an area of said second surfaces of said LED chips.

17. An LED device comprising:

a plurality of LED chips, each of said LED chips having opposite first and second surfaces, and a side surface that is connected between said first and second surfaces, and including a semiconductor stack having a first-type semiconductor layer, a second-type semiconductor layer, and a light-emitting layer located between the first semiconductor layer and the second semiconductor layer, and an electrode assembly disposed on the semiconductor stack and including a first electrode and a second electrode, wherein the first electrode is electrically connected to the first semiconductor layer, and the second electrode is electrically connected to the second semiconductor layer;

an electric circuit layer assembly disposed on said second surfaces of said LED chips, and having opposite first and second surfaces and a side surface that is connected between said first and second surfaces of said electric circuit layer assembly, said first surface of said electric circuit layer assembly being directly and electrically connected to said first and second electrodes of said electrode assembly; and an encapsulating layer enclosing said LED chips and said electric circuit layer assembly in such a manner that at least a portion of said second surface of said electric circuit layer assembly is exposed from said encapsulating layer, wherein said encapsulating layer has opposite upper and lower surfaces, said upper surface of said encapsulating layer being flush with said first surface of each of said LED chips, said lower surface of said encapsulating layer being flush with said second surface of said electric circuit layer assembly.

18. An LED device comprising:

a plurality of LED chips, each of said LED chips having opposite first and second surfaces, and a side surface that is connected between said first and second surfaces, and including a semiconductor stack having a first-type semiconductor layer, a second-type semiconductor layer, and a light-emitting layer located between the first semiconductor layer and the second semiconductor layer, and an electrode assembly disposed on the semiconductor stack and including a first electrode and a second electrode, wherein the first electrode is electrically connected to the first semiconductor layer, and the second electrode is electrically connected to the second semiconductor layer;

an electric circuit layer assembly disposed on said second surfaces of said LED chips, and having opposite first and second surfaces and a side surface that is connected between said first and second surfaces of said electric circuit layer assembly, said first surface of said electric circuit layer assembly being directly and electrically connected to said first and second electrodes of said electrode assembly; and an encapsulating layer enclosing said LED chips and said electric circuit layer assembly in such a manner that at least a portion of said second surface of said electric circuit layer assembly is exposed from said encapsulating layer, wherein said encapsulating layer includes a first encapsulating sub-layer and a second encapsulating sub-layer, said first encapsulating sub-layer covering said LED chips in such a manner that said first surface of each of said LED chips is exposed from said first encapsulating sub-layer, said second encapsulating sub-layer covering said electric circuit layer assembly in such a manner that at least a portion of said second surface of said electric circuit layer assembly is exposed from said second encapsulating sub-layer.

19. The LED device as claimed in claim 18, wherein a height of said second encapsulating sub-layer of said encapsulating layer is equal to a height of said electric circuit layer assembly.

* * * * *